United States Patent
Nojima

(10) Patent No.: US 8,415,738 B2
(45) Date of Patent: Apr. 9, 2013

(54) SEMICONDUCTOR MEMORY DEVICE AND MANUFACTURING METHOD THEREOF

(75) Inventor: Kazuhiro Nojima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 243 days.

(21) Appl. No.: 12/726,920

(22) Filed: Mar. 18, 2010

(65) Prior Publication Data

US 2010/0237407 A1    Sep. 23, 2010

(30) Foreign Application Priority Data

Mar. 18, 2009    (JP) .................................. 2009-065907

(51) Int. Cl.
*H01L 29/78* (2006.01)

(52) U.S. Cl.
USPC ............... 257/329; 257/4; 257/330; 257/347; 257/E29.262; 257/E47.001

(58) Field of Classification Search .................. 257/329, 257/E29.262, 4, 330, 336, 347, E29.268, 257/E47.001
See application file for complete search history.

(56) References Cited

U.S. PATENT DOCUMENTS

2008/0283816 A1*    11/2008    Takaishi ........................... 257/4

FOREIGN PATENT DOCUMENTS

| JP | 2008-288391 | 11/2008 |
|----|-------------|---------|
| JP | 2008-300623 | 12/2008 |
| JP | 2008-311641 | 12/2008 |
| JP | 2009-10366  | 1/2009  |

* cited by examiner

*Primary Examiner* — Lynne Gurley
*Assistant Examiner* — Vernon P Webb
(74) *Attorney, Agent, or Firm* — Morrison & Foerster LLP

(57) ABSTRACT

To provide a semiconductor memory device comprising a plurality of silicon pillars arranged in a matrix, whose sidewalls are provided with gate electrodes with gate insulating films interposed between the silicon pillars and the gate electrodes and whose top ends are electrically connected to memory elements, and a bit line and a word line provided between the silicon pillars so as to be orthogonal to each other. The bit line is electrically connected to a bottom end of the silicon pillars on both sides of the bit line in alternate rows, and the word line is electrically connected to a gate electrode formed on a sidewall of the silicon pillars on both sides of the word line in alternate columns.

5 Claims, 26 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device and a manufacturing method thereof, and more particularly relates to a semiconductor memory device including a vertical transistor using a silicon pillar and a method of manufacturing the semiconductor memory device.

2. Description of Related Art

In recent years, the integration enhancement of semiconductor memory devices has been mainly achieved by downscaling the transistor size. However, the downscaling of the transistor size is coming close to its limit, and if the transistor size is reduced even more, it may cause a malfunction of the transistor due to a short channel effect or the like.

As a measure to fundamentally solve such a problem, a method of forming transistors in a three-dimensional manner by three-dimensionally processing a semiconductor substrate has been proposed. In particular, a three-dimensional transistor that uses a silicon pillar that extends in a vertical direction with respect to a main plane of the semiconductor substrate as a channel has an advantage in that its occupation area is small, a large drain current can be obtained by a complete depletion, and it is possible to realize the close-packed layout of $4F^2$ (where F is the minimum feature size) (see Japanese Patent Application Laid-open Nos. 2008-288391, 2008-300623, 2008-311641, and 2009-010366).

There are various types of specific configurations of vertical transistors using silicon pillars, and according to one of them, bit lines are provided between a large number of silicon pillars arranged in a matrix. While each of the bit lines is electrically connected to a top end or a bottom end of each of adjacent silicon pillars, the bit line is connected to only silicon pillars on one side in an extending direction of the bit line. Specifically, such connection is realized by providing an opening at a part of an oxide film for insulation that covers the bit line.

Because the vertical transistor using silicon pillars is for realizing a close-packed layout of $4F^2$, the oxide film for insulation that covers the bit line is made considerably thin. Therefore, to form the opening, a processing precision of F value or lower is required. Accordingly, it is very difficult to form the opening.

SUMMARY

In one embodiment, there is provided a semiconductor memory device comprising: a plurality of silicon pillars arranged in a matrix, each of the silicon pillars having a sidewall, a top end and a bottom end; a plurality of memory element each connected to the top end of an associated one of silicon pillars; a plurality of gate electrodes each covering the sidewall of an associated one of the silicon pillars via a gate insulating film interposed therebetween; a plurality of bit lines extending to a column direction, the bit lines being provided between the silicon pillars and electrically connected to the bottom ends of corresponding silicon pillars on both sides of respective bit lines in alternate rows; and a plurality of a word lines extending to a row direction, the word line being provided between the silicon pillars and electrically connected to the gate electrodes on both sides of respective word lines in alternate columns.

In another embodiment, there is provided a semiconductor memory device comprising: a first bit line and a first word line orthogonal to each other; first to fourth silicon pillars each having a sidewall, a top end and a bottom end; first to fourth memory elements connected to the top end of the first to fourth silicon pillars, respectively; and first to fourth gate electrodes covering the sidewall of the first to fourth silicon pillars, respectively via a gate insulating film interposed therebetween, wherein the first and second silicon pillars are adjacent to each other with the first bit line interposed therebetween, the third and fourth silicon pillars are adjacent to each other with the first bit line interposed therebetween, the first and third silicon pillars are adjacent to each other with the first word line interposed therebetween, the second and fourth silicon pillars are adjacent to each other with the first word line interposed therebetween, the first bit line is electrically connected to the bottom ends of the third and fourth silicon pillars, and the first word line is electrically connected to the first and third gate electrodes.

In still another embodiment, there is provided a manufacturing method of a semiconductor memory device comprising: forming a silicon pillar group including a plurality of silicon pillars arranged in matrix and a plurality of silicon bridges each of which connects lower parts of two silicon pillars adjacent to each other in a row direction in alternate rows and columns, lower parts among the silicon pillars being filled with an insulating layer, a height of the insulating layer being at least as same as that of a top surface of the silicon bridges; forming bit trenches along bit-line-forming areas that extend to a column direction located between the silicon pillars by etching the silicon bridges and the insulating layer; and forming bit lines each buried in an associated one of the bit trenches.

In still another embodiment, there is provided a manufacturing method of a semiconductor memory device comprising: etching a silicon substrate to a first depth using a plurality of first mask patterns each masking two silicon-pillar-forming areas adjacent to each other in a row direction, the first mask patterns masking two silicon-pillar-forming areas alternately every other rows; forming an insulating layer that is buried in trenches formed by etching the silicon substrate; etching the silicon substrate and the insulating layer to a second depth that is shallower than the first depth using a second mask pattern that masks an area other than bit-line-forming areas that extend to a column direction located between silicon pillars; forming bit trenches along the bit-line-forming areas by etching the silicon substrate and the insulating layer; and forming bit lines each buried in an associated one of the bit trenches.

According to the present invention, at a part where a bit line is connected to a silicon pillar, an opening does not need to be provided only on one side of the bit line. Therefore, the opening is easily formed. The bit line is electrically connected to the silicon pillar on both sides of the bit line in alternate columns, and the word line is connected to a gate electrode formed on a sidewall of the silicon pillar on both sides of the word line in alternate columns. Accordingly, selection and read/write of memory cells can be performed appropriately.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before an embodiment of the present invention is described in detail, a configuration of a semiconductor memory device according to a related technique of the present invention is described.

Figure 25:
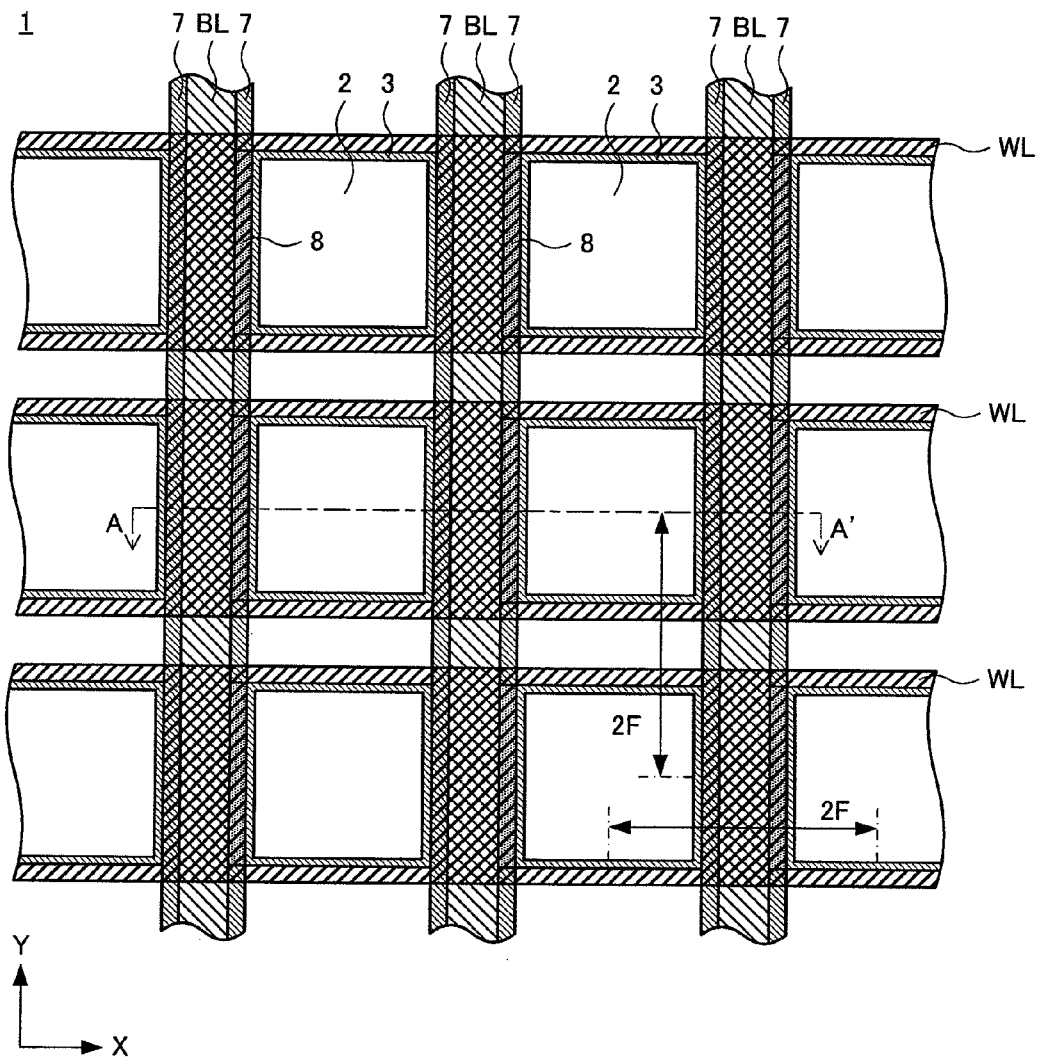
FIG. 25 is a plan view of a semiconductor memory device 1 according to the related technique.
Figure 26:
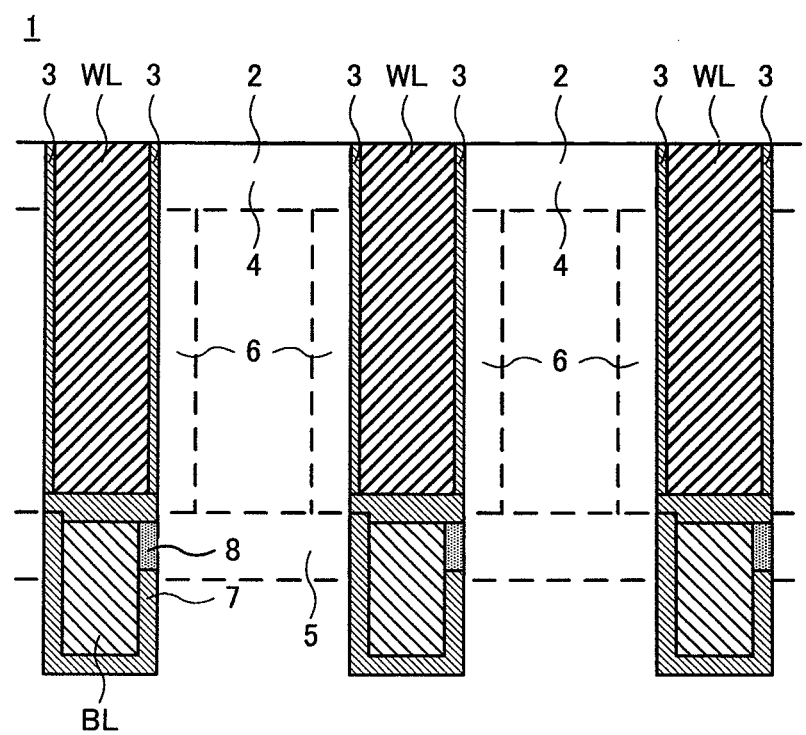
FIG. 26 is a cross-sectional view along a line A-A' in FIG. 25.

FIG. 25 is a plan view of a semiconductor memory device 1 according to the related technique. FIG. 26 is a cross-sectional view along a line A-A' in FIG. 25. As shown in FIG. 25, the semiconductor memory device 1 includes a large number of silicon pillars 2 arranged in a matrix with an interval of 2F (a center distance). A large number of bit lines BL extending in a column direction (a Y direction shown in FIG. 25) are provided between the silicon pillars 2. Word lines WL crossing the silicon pillars and extending in a row direction (an X direction shown in FIG. 25) are provided. The bit line BL and the word line WL have a pitch of 2F.

Each of the silicon pillars 2 functions as a cell transistor and the word line WL becomes a gate electrode for the cell transistor. Accordingly, a gate insulating film 3 is provided on side surfaces of the silicon pillar 2.

Impurity diffusion regions 4 and 5 at a top end and a bottom end of each of the silicon pillars 2 become a source region and a drain region for the cell transistor. The impurity diffusion region 4 at the top end is electrically connected to a memory element (not shown) such as a capacitor. The impurity diffusion region 5 at the bottom end is connected to the bit line BL.

Connection of the bit line BL and the impurity diffusion region 5 is described below in detail. While the bit line BL is covered by an insulating film 7 so as to be isolated from other components, a part thereof is provided with an opening 8. The bit line BL is connected to the impurity diffusion region 5 via the opening 8. The opening 8 is provided between the bit line BL and the silicon pillar 2 adjacent to the bit line BL on an X direction one side (right side in FIG. 25). Accordingly, the bit line BL is connected to the silicon pillars 2 adjacent thereto on the X direction one side.

An operation of the cell transistor is described below. When read/write is performed on a memory element, the word line WL which is the gate electrode for the silicon pillar 2 connected to the memory element is activated. A channel 6 is thus formed between the impurity diffusion region 4 at the top end of the silicon pillar 2 and the impurity diffusion region 5 at the bottom end thereof and the bit line BL is electrically connected to the memory element. In this way, read/write can be performed on the memory element using the bit line BL.

The opening 8 for connecting the bit line BL to the impurity diffusion region 5 is considerably small as compared to a minimum feature dimension F as seen from FIGS. 25 and 26. It is thus difficult to form the opening 8 in the semiconductor memory device 1 of the related technique. In view of such a problem, a semiconductor memory device of the present embodiment enables an opening for electrically connecting a bit line BL to a silicon pillar to be easily formed.

A configuration of the semiconductor memory device according to the present embodiment is described next.

Figure 1:
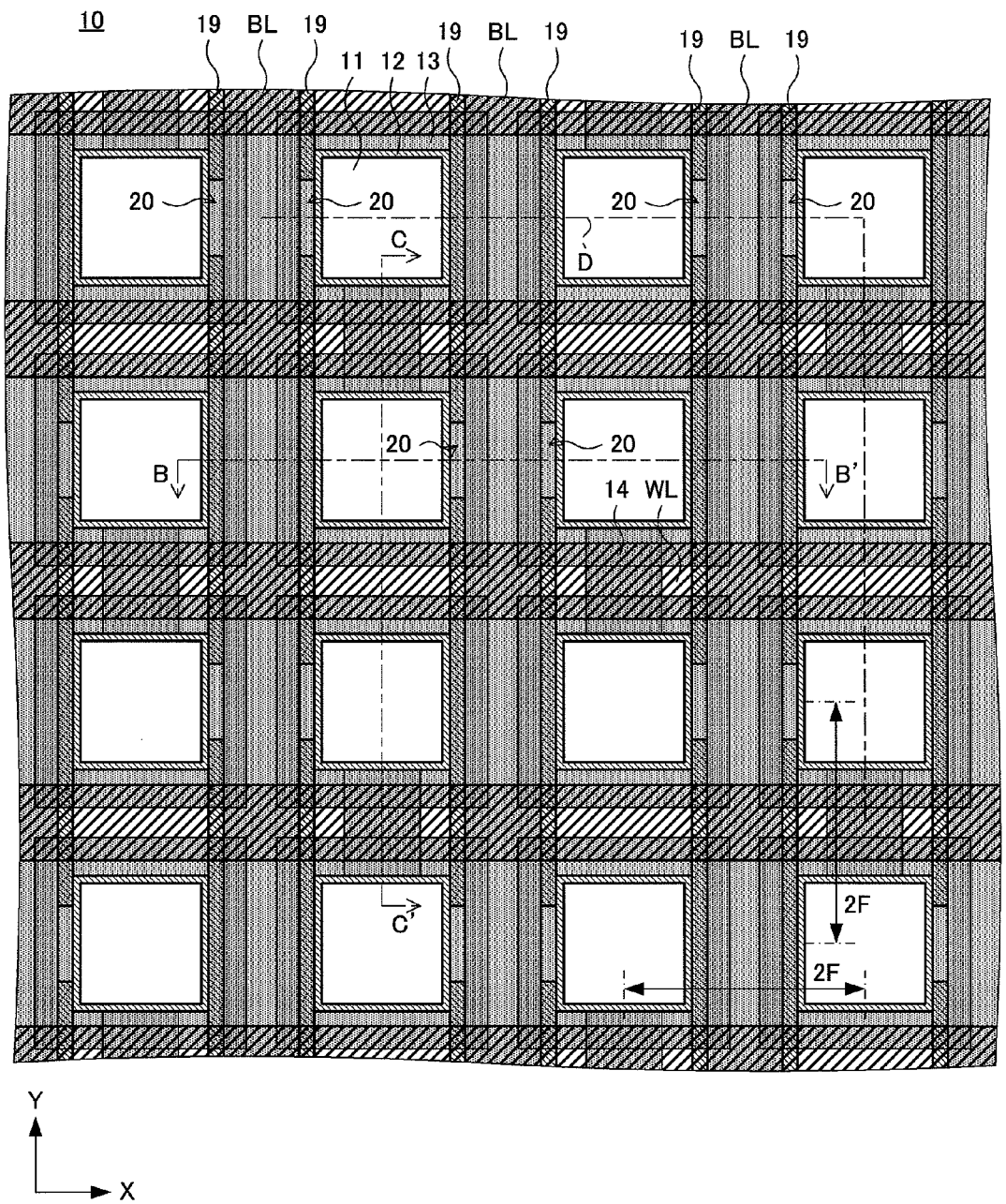
FIG. 1 is a plan view of a semiconductor memory device according to the embodiment of the present invention.
Figure 2:
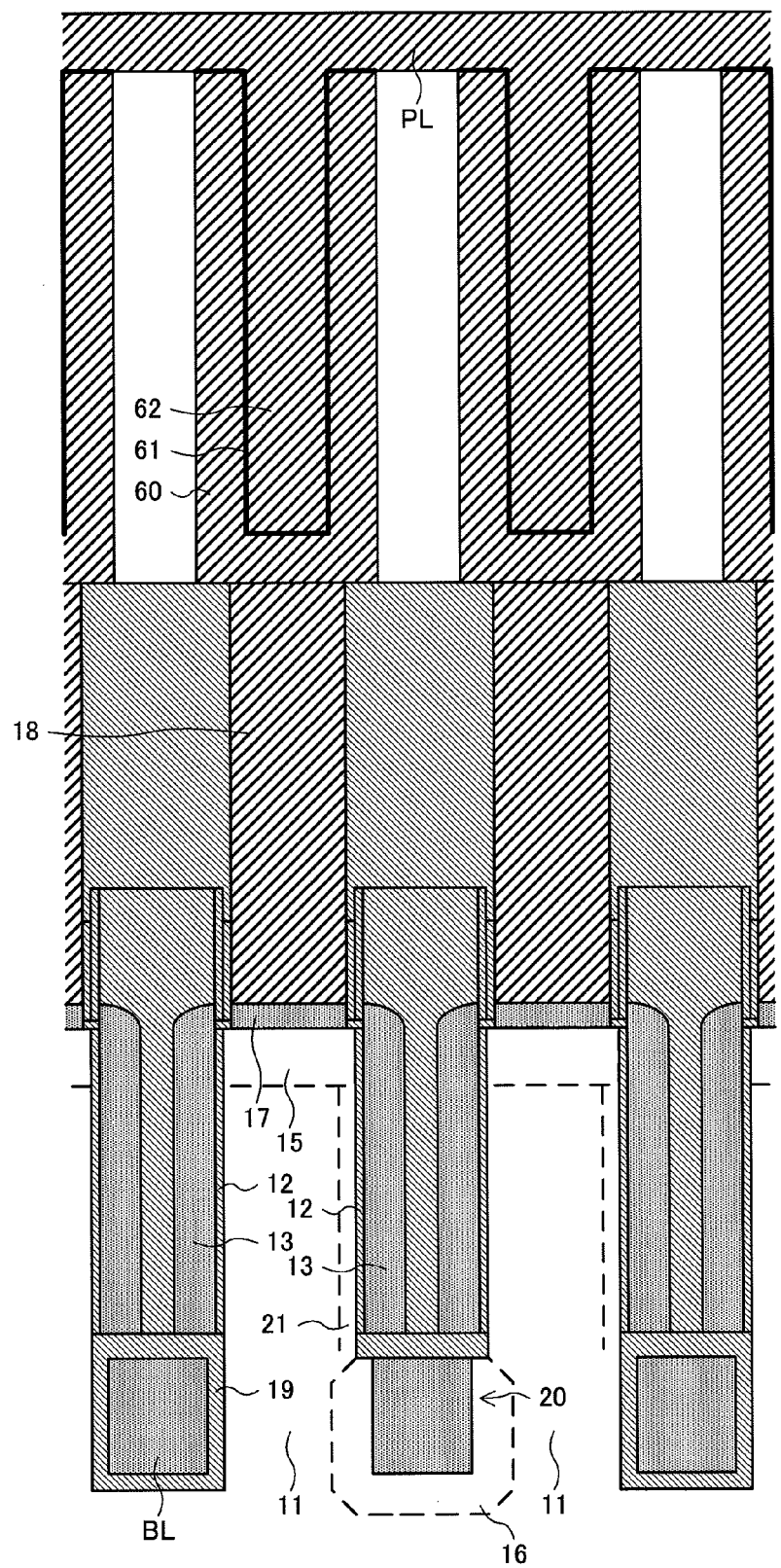
FIG. 2 is a cross-sectional views along a line B-B' shown in FIG. 1.
Figure 3:
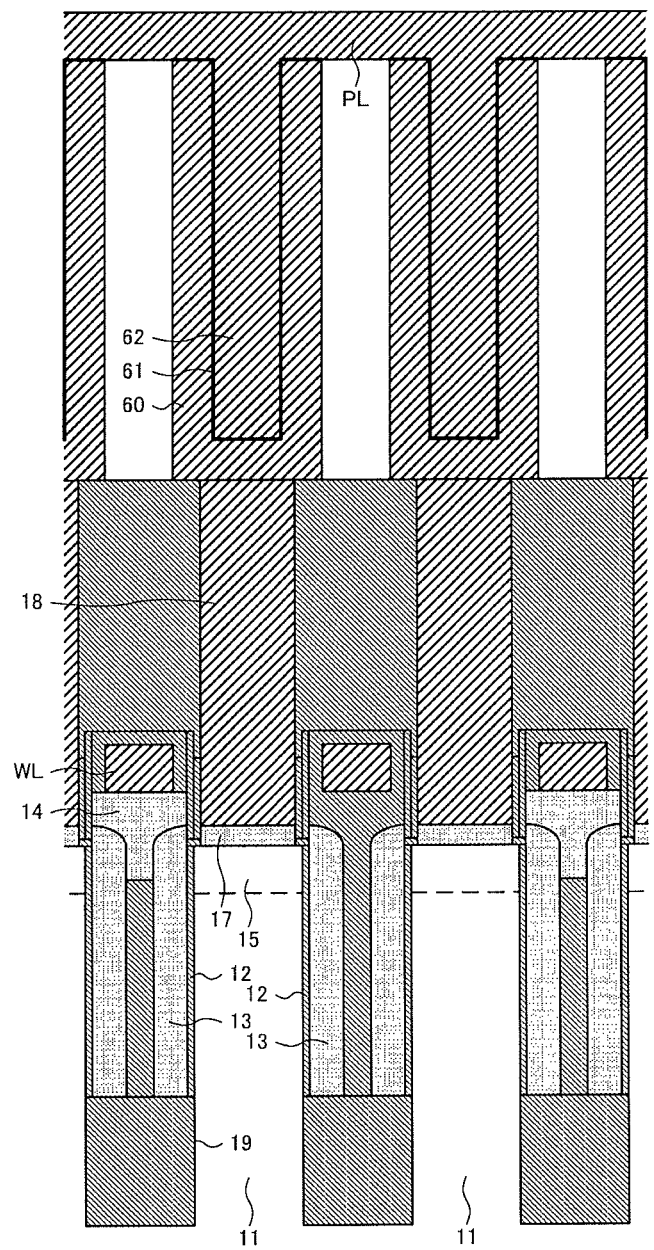
FIG. 3 is a cross-sectional views along a line C-C' shown in FIG. 1.

FIG. 1 is a plan view of a semiconductor memory device 10 according to the present embodiment. FIGS. 2 and 3 are cross-sectional views along a line B-B' and a line C-C' shown in FIG. 1, respectively. The semiconductor memory device 10 is formed on a P-type silicon substrate and includes a large number of silicon pillars 11 arranged in a matrix with an interval of 2F (a center distance), as shown in FIG. 1. A large number of bit lines BL extending in a column direction (a Y direction shown in FIG. 1) and a large number of word lines WL extending in a row direction (an X direction shown in FIG. 1) are provided between the silicon pillars 11. The bit line BL and the word line WL have a pitch of 2F as in the related technique.

A gate electrode 13 is formed on sidewalls of the silicon pillar 11 with a gate insulating film 12 interposed therebetween. A gate contact 14 is provided at a part of top end of the gate electrode 13. The gate contact 14 connects the gate electrode 13 to the word line WL.

An arrangement of the gate contacts 14 is described below. The gate contact 14 is provided between gate electrodes of two silicon pillars 11 adjacent to each other in the Y direction as shown in FIG. 3 and connects the gate electrodes. Accordingly, the gate electrodes of the two silicon pillars 11 are connected to the same word line WL.

When paying attention to a series of the silicon pillars 11 belonging to a certain row, the silicon pillars 11 connected by the gate contact 14 are placed in directions different from each other. The word line WL is thus electrically connected to the gate electrode 13 formed on the sidewall of the silicon pillar 11 on both sides of the word line WL in alternate columns. Adjacent word lines WL are connected to the gate electrodes 13 formed on the sidewalls of the silicon pillars 11 shifted from each other by one column. In other words, one word line WL is connected to the gate electrode 13 formed on the sidewall of the silicon pillar 11 different from the one for the other adjacent word line WL.

An N-type impurity diffusion region 15 which becomes one of a source region and a drain region is provided at a top end of the silicon pillar 11. The impurity diffusion region 15 is electrically connected through an epitaxial layer 17 and a contact plug 18 shown in FIGS. 2 and 3 to a memory element. When the semiconductor memory device 10 is a DRAM (Dynamic Random Access Memory), a capacitor is used as the memory element. Meanwhile, when the semiconductor memory device 10 is a PRAM (Phase change Random Access Memory), a phase-change film is used as the memory element. FIGS. 2 and 3 show an example of using the capacitor as the memory element. In this case, a cylindrical lower electrode 60 is placed on the contact plug 18 and an upper electrode 62 is placed within the lower electrode 60 with a capacitive insulating film 61 interposed therebetween, as shown in FIGS. 2 and 3. The upper electrode 62 is connected to a reference potential wiring PL.

An N-type impurity diffusion region 16 which becomes the other of the source region and the drain region is provided at a bottom end of the silicon pillar 11 so as to surround an exposed bit line BL.

Connection of the bit line BL and the impurity diffusion region 16 is described below in detail. While the bit line BL is covered by a silicon oxide film 19 so as to be isolated from other components, a part of the silicon oxide film 19 is provided with an opening 20. The bit line BL is connected to the impurity diffusion region 16 through the opening 20. As shown in FIG. 1, the opening 20 is provided between the silicon pillars 11 adjacent to each other on both sides of the bit line BL in alternate rows. Accordingly, the bit line BL is electrically connected to the silicon pillar 11 on its both sides in alternate rows.

When paying attention to a series of the silicon pillars 11 belonging to a certain column, bit lines BL connected by the opening 20 are placed in directions different from each other. This means that, in terms of the bit line BL, adjacent bit lines BL are connected to the silicon pillars 11 shifted from each other by one row. In other words, one bit line BL is connected to the silicon pillar 11 different from the one connected by the other adjacent bit line BL.

An operation of the cell transistor realized by the configuration described above is described next. When read/write is performed on a certain memory element, the word line WL connected to the gate electrode 13 of the silicon pillar 11 connected to that memory element is activated. A channel 21 is then formed between the impurity diffusion region 15 at the top end of the silicon pillar 11 and the impurity diffusion region 16 at the bottom end thereof, as shown in FIG. 2. Cell transistors configured by the respective silicon pillars 11 are thus switched on. The memory elements connected to the silicon pillars 11 are connected to the bit lines BL.

Figure 4:
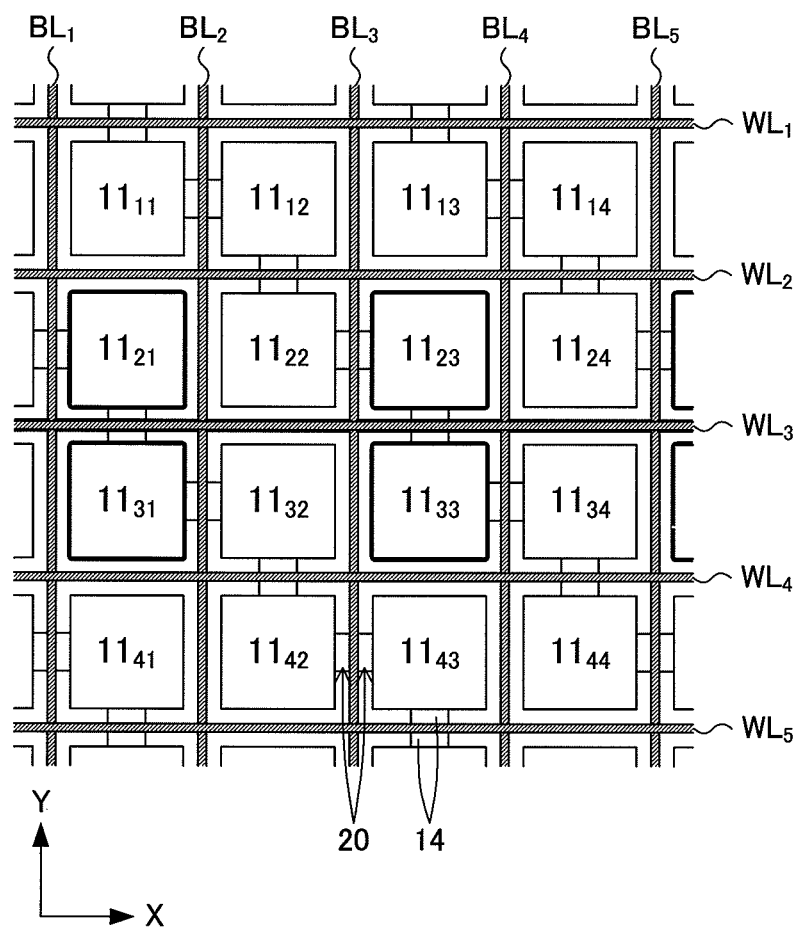
FIG. 4 is a schematic plan view of the semiconductor memory device according to the embodiment of the present invention.

FIG. 4 is an explanatory diagram of the operation of the cell transistor and is a schematic plan view of the semiconductor memory device 10. In FIG. 4, among the components shown in FIG. 1, only the silicon pillar 11, the word line WL, the gate contact 14, the bit line BL, and the opening 20 are shown. Further, in FIG. 4, subscripts are attached to reference characters of the silicon pillar 11 (indicated by a square including the gate insulating film 12 and the gate electrode 13 in FIG. 4), the word line WL, and the bit line BL. In the following descriptions of FIG. 4, these components are identified by referring to these subscripts.

When a word line $WL_3$ is activated in the example of FIG. 4, the channel 21 (FIG. 2) is formed in silicon pillars $11_{21}$, $11_{23}$, $11_{31}$, and $11_{33}$. The cell transistors configured by the silicon pillars $11_{21}$, $11_{23}$, $11_{31}$, and $11_{33}$ are thus switched on. The silicon pillars $11_{21}$, $11_{23}$, $11_{31}$, and $11_{33}$ are electrically connect to bit lines $BL_1$, $BL_2$, $BL_3$, and $BL_4$, respectively. Because one memory element is connected to one bit line BL, read/write can be performed on the memory element using the bit line BL.

As described above, in a part where the bit line BL is connected to the silicon pillar 11, the opening at the one side shown in FIG. 26 does not need to be provided in the semiconductor memory device 10. Specifically, because the bit line BL is connected to the silicon pillar 11 on its both sides in the part where the bit line BL is connected to the silicon pillar 11 according to the semiconductor memory device 10, the entire surface except for the top surface can be the opening as shown in FIG. 2. Accordingly, the opening can be easily formed.

Further, the bit line BL is electrically connected to the silicon pillar 11 on its both sides in alternate rows and the word line WL is connected to the gate electrode 13 formed on the sidewall of the silicon pillar 11 on both sides of the word line WL in alternate columns. Therefore, read/write on memory elements can be performed using bit lines BL as described above. Accordingly, selection and read/write can be performed appropriately on memory cells in the semiconductor memory device 10.

A manufacturing method of the semiconductor memory device 10 is explained next with reference to FIGS. 5 to 22. Among FIGS. 5 to 22, FIGS. 5, 6, 16, and 18 are plan views of the semiconductor memory device 10. Drawings except for these four drawings are side perspective cross-sectional views of the semiconductor memory device 10 including a cross-sectional view along a line D in FIG. 1.

Figure 5:
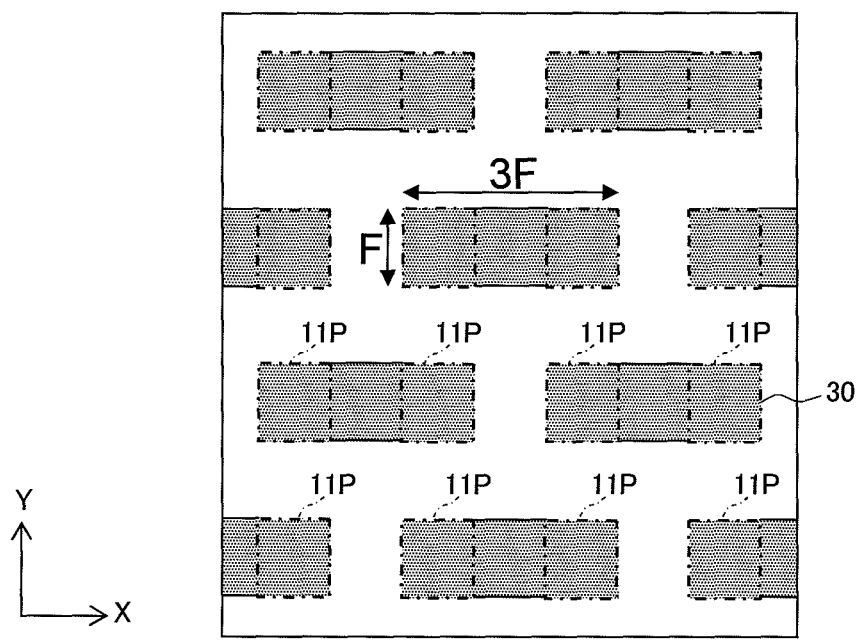
FIGS. 5, 6, 16, 18 are plan views of the semiconductor memory device according to the embodiment of the present invention and show apart of the manufacturing process of the semiconductor memory device, respectively.
Figure 6:
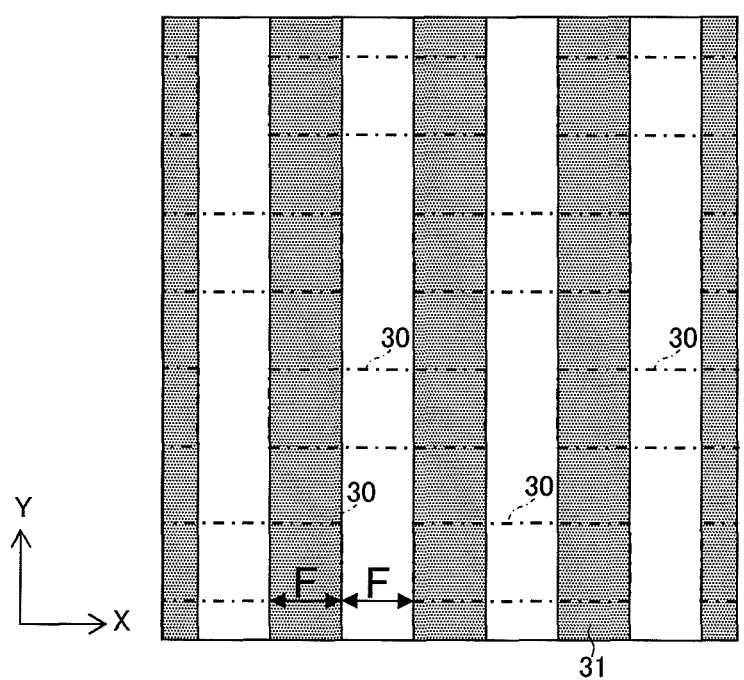

FIGS. 5 and 6 show a first mask pattern and a second mask pattern for forming the silicon pillar 11. The silicon pillar 11 is formed using the first and second mask patterns by so-called double patterning techniques.

A rectangular area 11p shown by a chain line in FIG. 5 represents an area where the silicon pillar is formed. As shown in FIG. 5, the first mask pattern has a plurality of sub-mask patterns 30 (3F×F patterns) each of which is for masking two areas 11p where the silicon pillar is formed in the X direction. The two areas 11p where the silicon pillar is formed adjacent to each other in the Y direction are masked by the respective sub-mask patterns 30 with the areas 11p where the silicon pillar is formed in opposite directions.

On the other hand, the second mask pattern is for masking an area other than the area where the bit line is provided as shown in FIG. 6, and specifically has stripe patterns 31 with a width of F and an interval of F. The rectangular area 30 shown by the chain line in FIG. 6 is the sub-mask pattern 30 shown in FIG. 5.

First, a silicon nitride film is deposited first on a P-type silicon substrate with a thin silicon oxide film interposed therebetween and the resultant substrate is patterned in the first mask pattern shown in FIG. 5. Specifically, as shown in FIG. 5, the patterns 30 each of which has a length of 3F in an X direction and a length of F in a Y direction are formed in a matrix with an interval of F in the X and Y directions. In adjacent rows, the patterns 30 are formed so as to be shifted from each other by 2F in the X direction.

Figure 7:
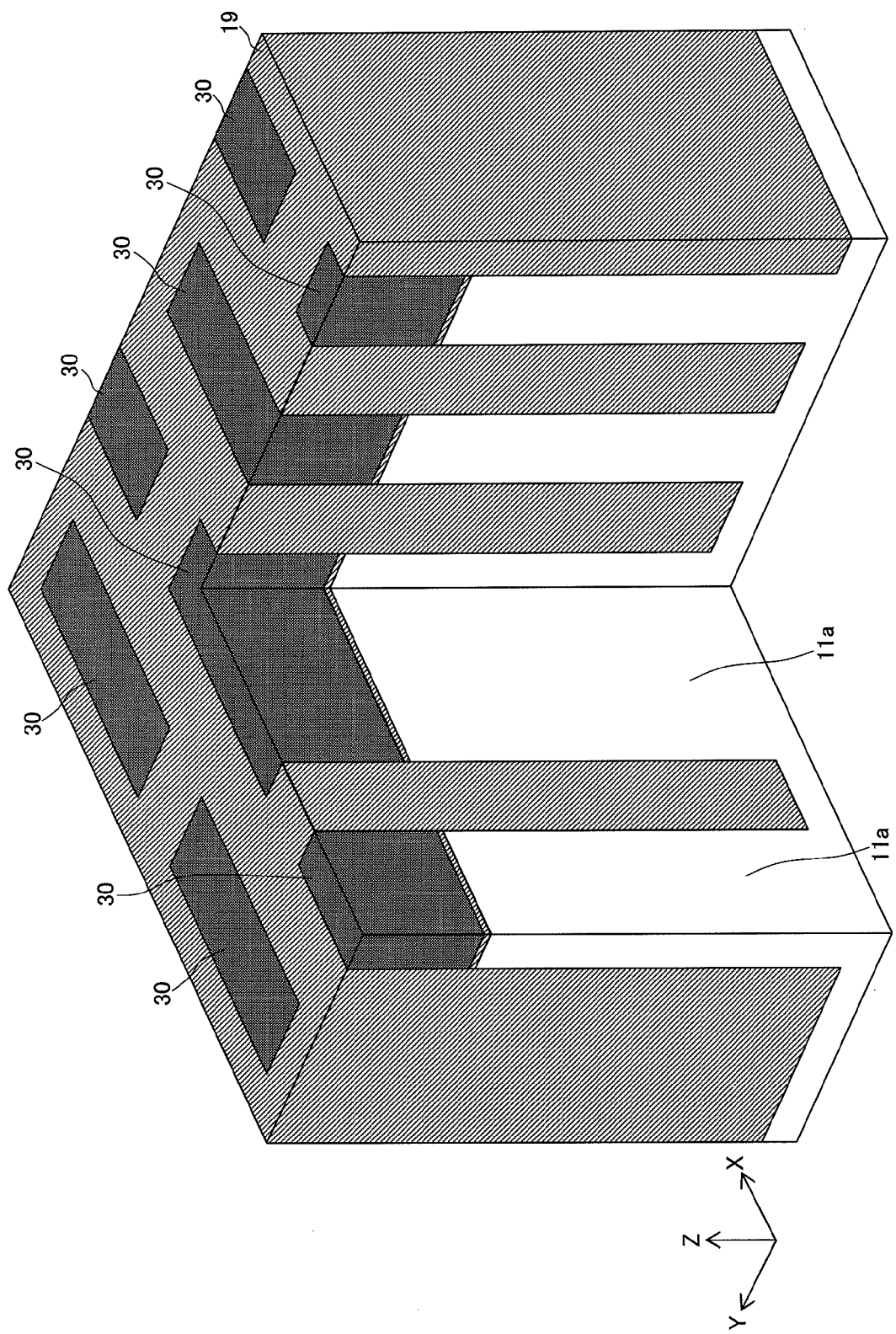
FIGS. 7 to 15, 17, 19 to 22 are side perspective cross-sectional views of the semiconductor memory device according to the embodiment of the present invention and show a part of the manufacturing process of the semiconductor memory device, respectively.

The silicon substrate is then selectively etched to a depth of around 200 nm (a first depth). As a result, a silicon pillar 11a whose cross-section in an XY plane has a dimension of 1F×3F is formed. Thereafter, as shown in FIG. 7, the silicon oxide film 19 (an insulating layer) is buried between the silicon pillars 11a and the surface is flattened by CMP (Chemical Mechanical Polishing).

Next, a silicon nitride film is deposited again with a thin silicon oxide film interposed therebetween and the resultant substrate is patterned in the second mask pattern shown in FIG. 6. Specifically, as shown in FIG. 6, the stripe patterns 31 with a width of F and an interval of F are formed. A longitudinal direction of the stripes is the Y direction.

Figure 8:
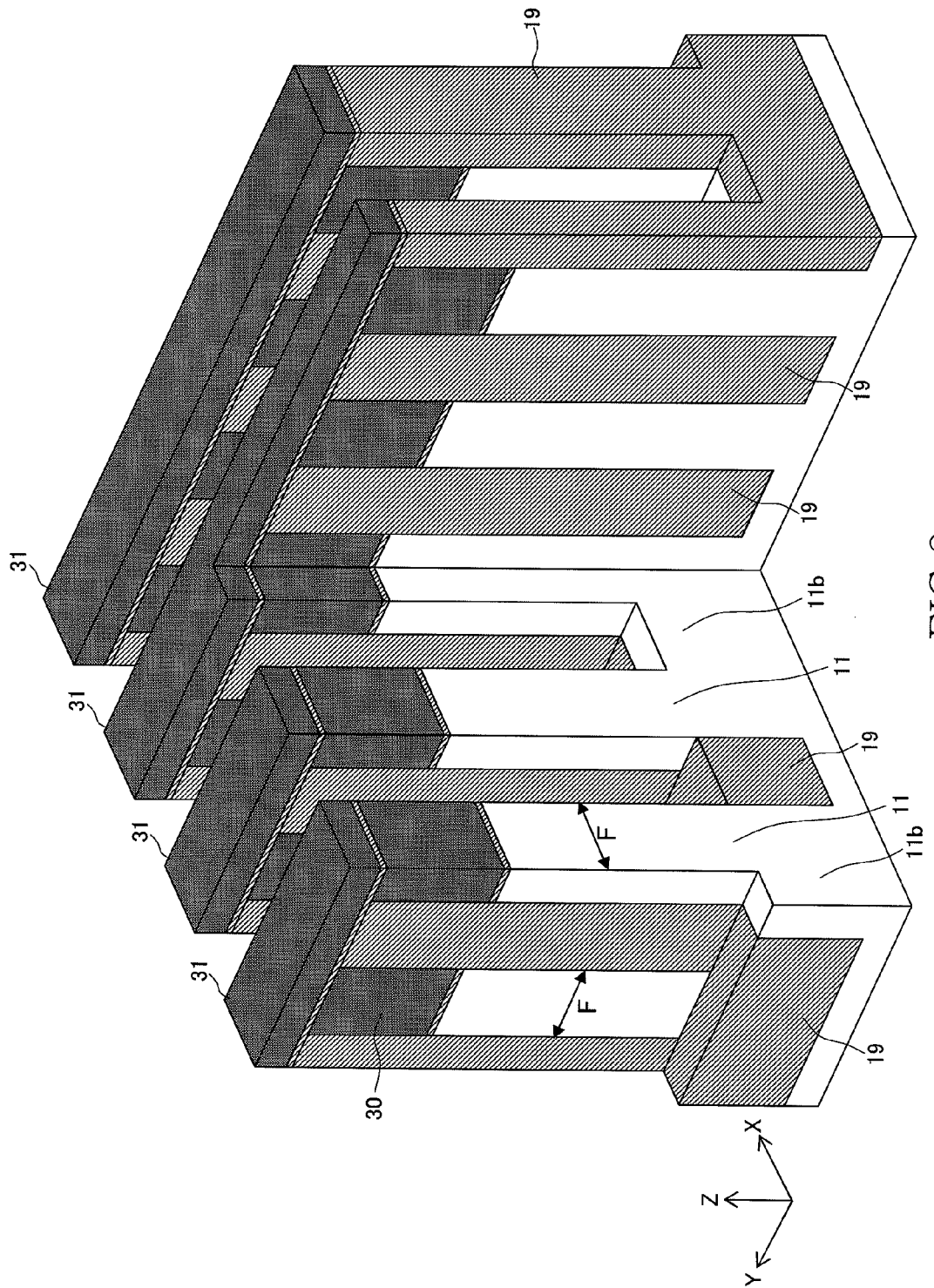

The pattern 30, the silicon oxide film 19, and the silicon substrate are etched to a depth of 50 nm (a second depth) from a bottom end of the silicon pillar 11a. While the silicon nitride film, the silicon oxide film, and the silicon substrate must be etched at a constant speed, this is realized by dry etching with a plurality of steps. As a result of etching, as shown in FIG. 8, the silicon pillars 11 whose cross-sections in the XY plane have a dimension of 1F×1F are formed in the matrix shown in FIG. 1. A silicon bridge 11b for connecting the two silicon pillars 11 adjacent to each other in the X direction is formed at the bottom of the silicon pillars 11. The two silicon pillars 11 adjacent to each other in the Y direction are connected to the silicon pillars 11 in opposite directions by the silicon bridge 11b.

Figure 9:
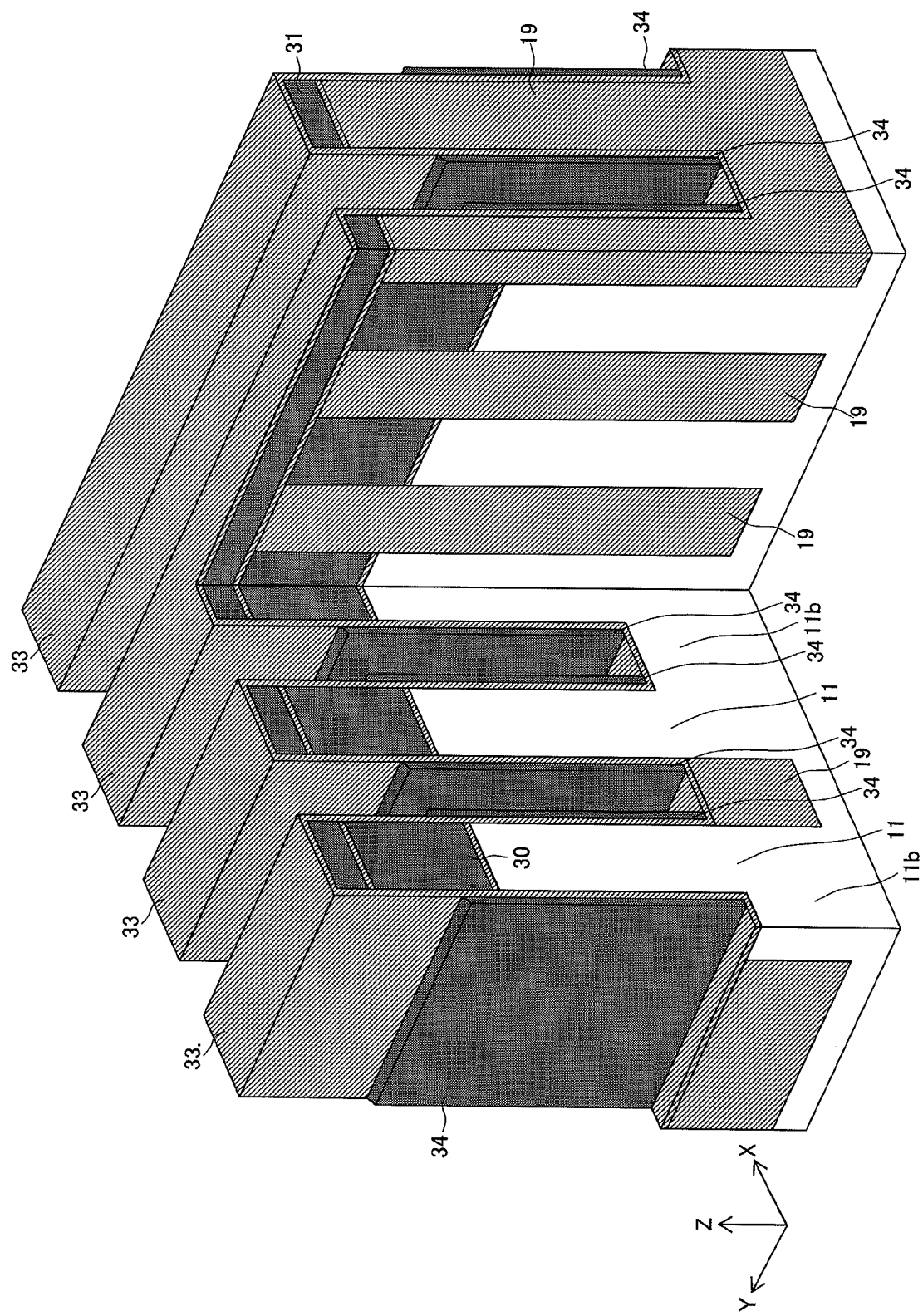

Thermal oxidation is then performed upon the surface, so that a silicon oxide film 33 is formed on the entire surface as shown in FIG. 9. The silicon oxide film 33 is formed for protecting the surface. Silicon nitride is then deposited and etched back, so that a sidewall nitride film 34 (an insulating film) with a thickness of about 5 nm is formed on the sidewall of the silicon pillar 11. As shown in FIG. 9, while the top end of the sidewall nitride film 34 is placed lower than the top surface of the silicon oxide film 33, this configuration is the result of the process.

Figure 10:
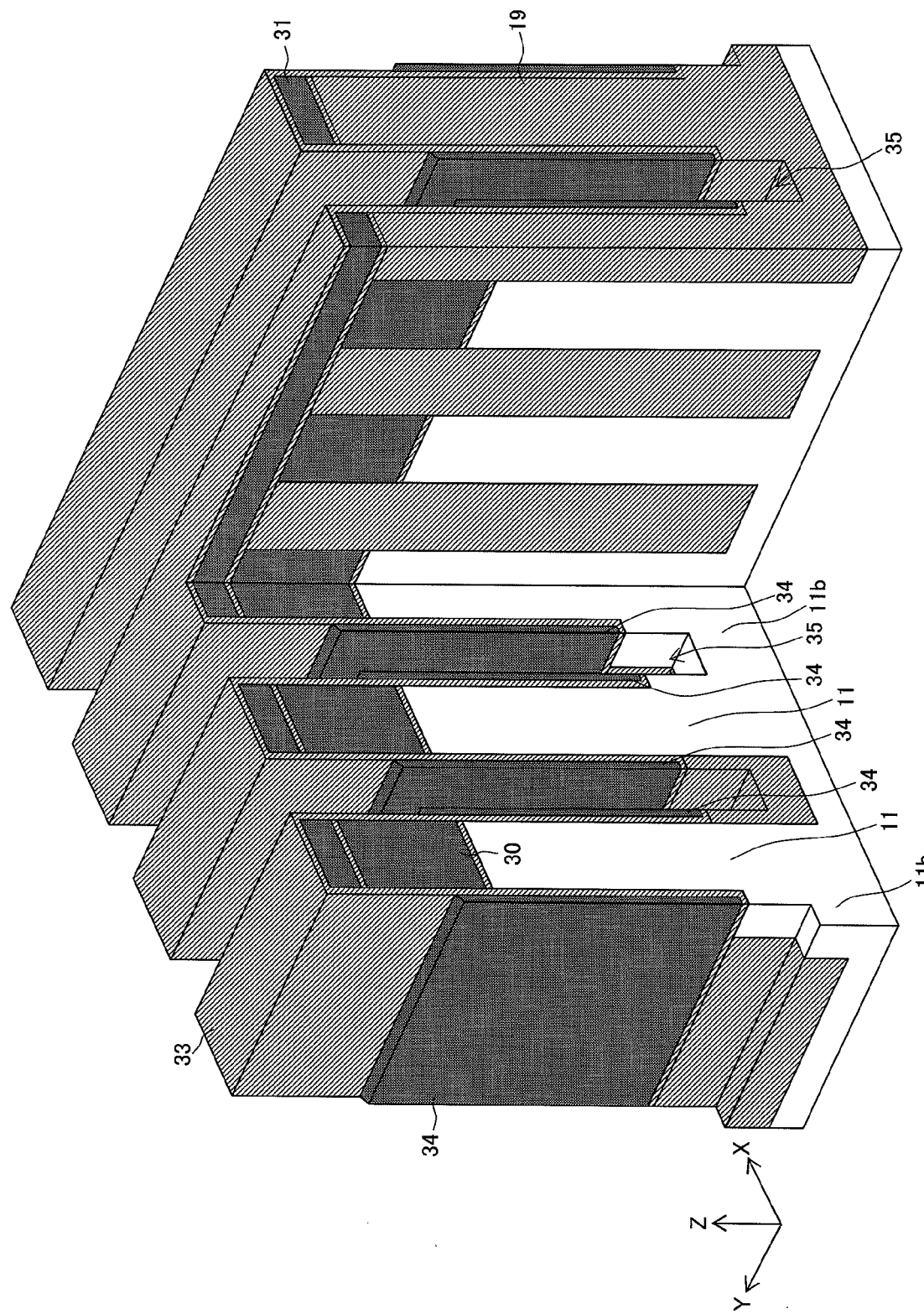

The silicon oxide film 19 and the silicon substrate are then etched using the sidewall nitride film 34 as a stopper, so that a trench 35 (a bit trench) extending through the silicon bridge 11b and the silicon oxide film 19 in the X direction is formed between the silicon pillars 11 as shown in FIG. 10. Because the silicon oxide film and the silicon substrate must be etched at a constant speed also in this case, dry etching with a plurality of steps is used.

Figure 11:
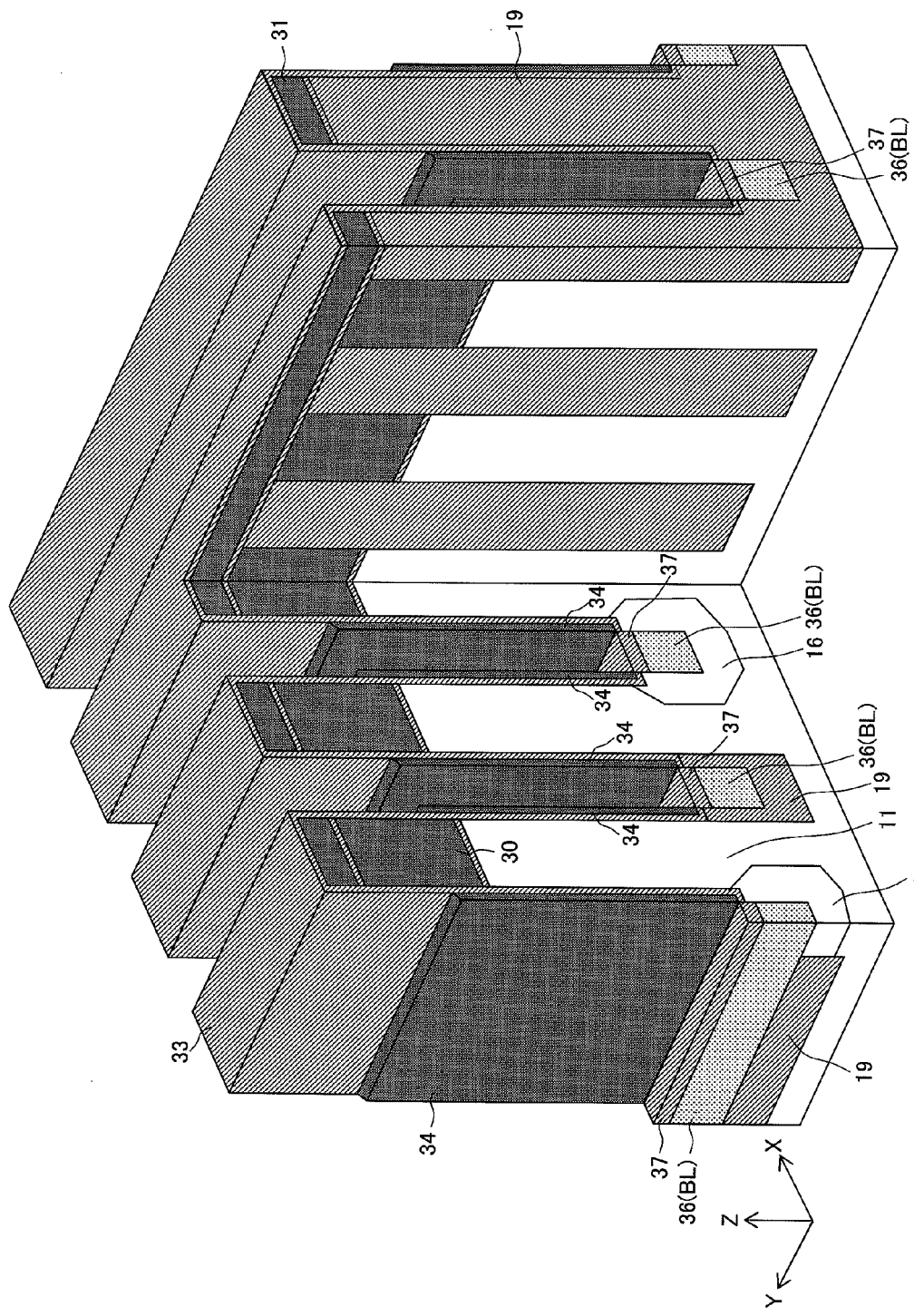

After the trench 35 is formed, a high density polysilicon 36 (doped polysilicon that high density impurity is doped) which becomes the bit line BL is formed in the trench 35 and etched back. Because of impurity diffusion from polysilicon, the N-type impurity diffusion region 16 is formed within the silicon pillar 11 around the high density polysilicon 36. As shown in FIG. 11, the surface of the high density polysilicon 36 is oxidized to form a silicon oxide film 37 for separating the bit line BL from upper layers.

Figure 12:
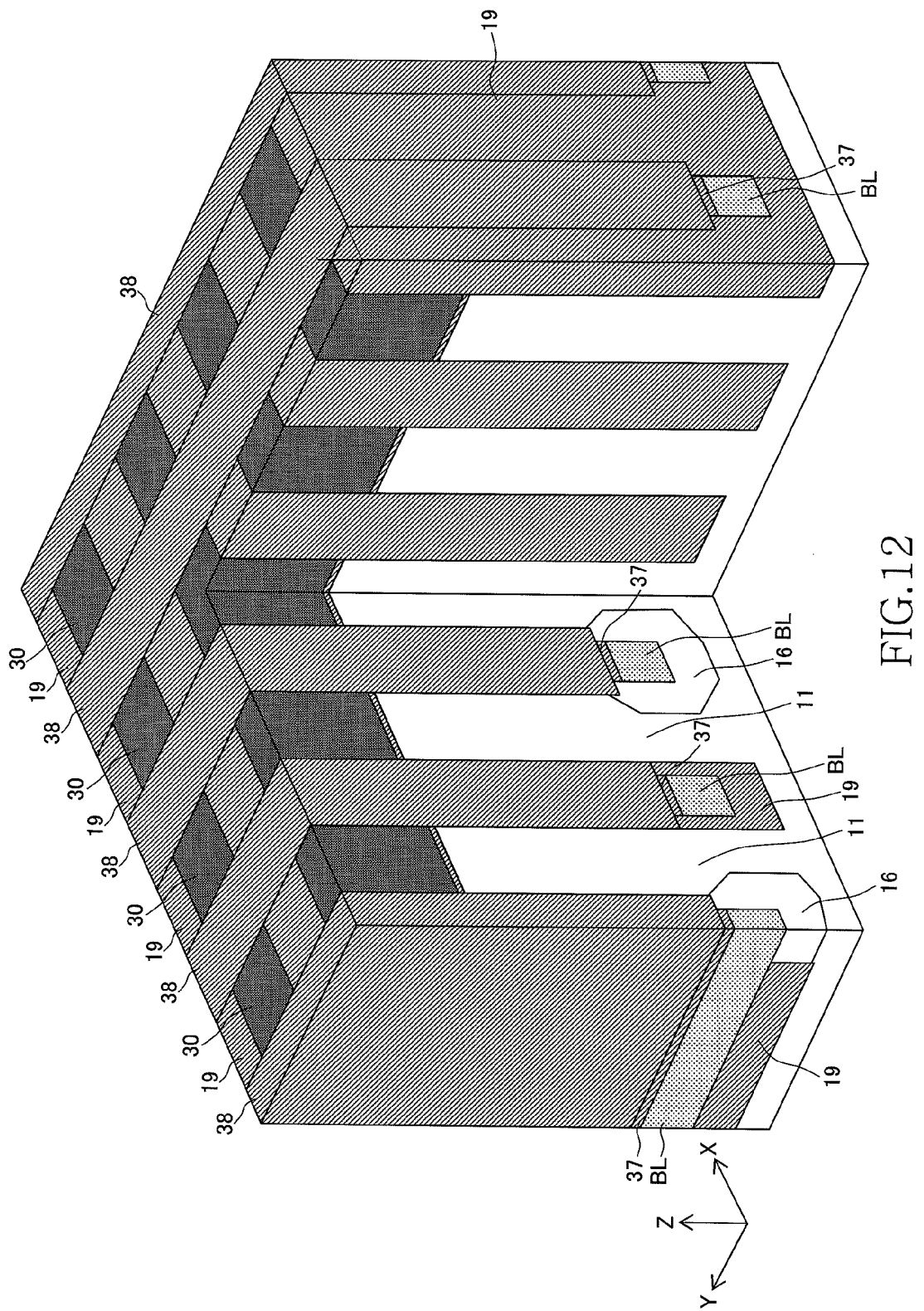

When the above steps are completed, the silicon oxide film 33, the sidewall nitride film 34, and the stripe pattern 31 (the second mask pattern) are removed. As shown in FIG. 12, a silicon oxide film 38 is buried between the silicon pillars 11 and flattened by CMP so that the surface of the pattern 30 (the first mask pattern) is exposed.

Figure 13:
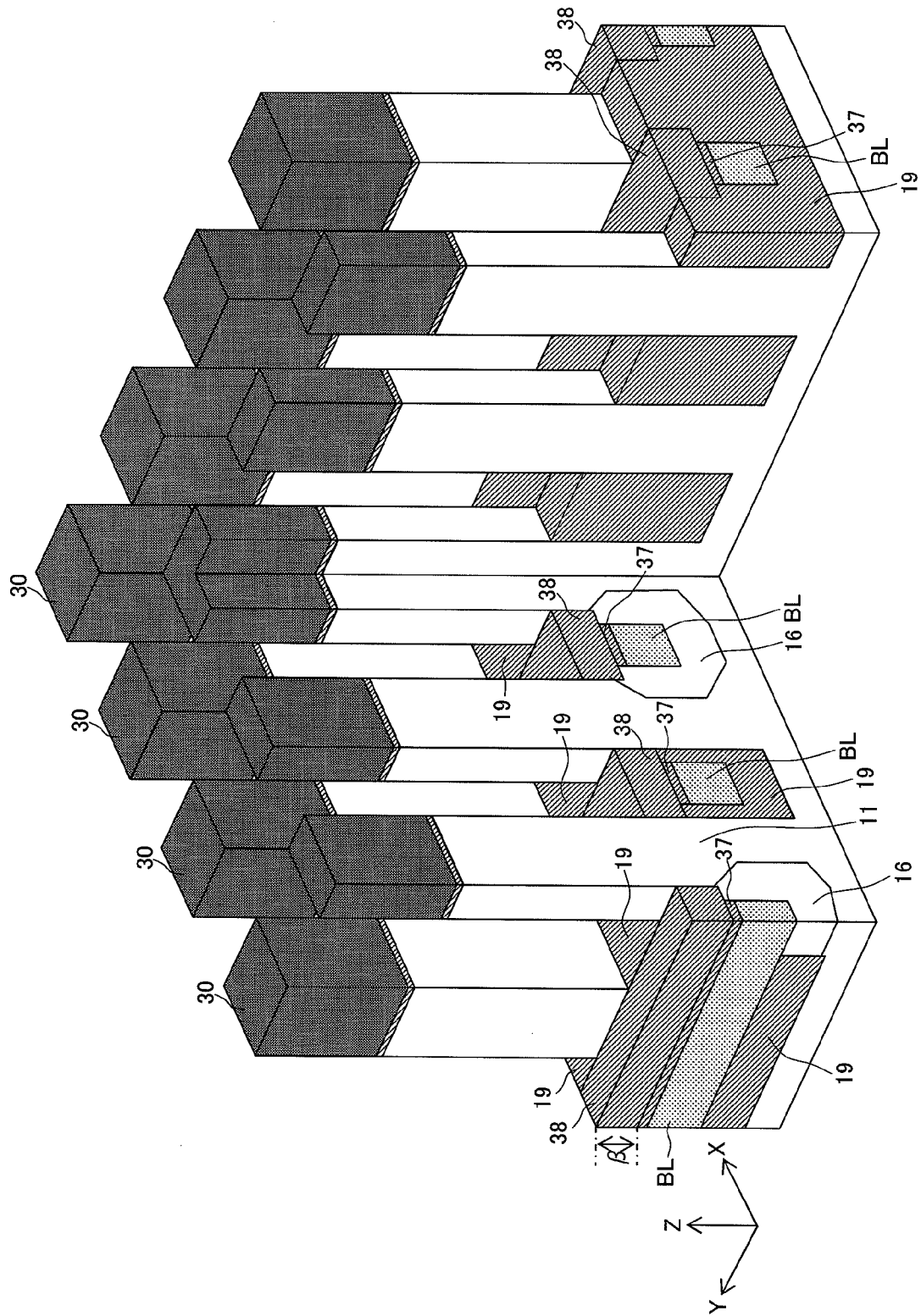

Next, the silicon oxide film 38 is etched back entirely to form the gate electrode. At this time, etching back is performed so that the silicon oxide film 38 (an insulating film) with a thickness of about β is remained as shown in FIG. 13. The silicon oxide film 38 is formed to accommodate steps formed by etching different materials at the time of forming the bit line BL, as well as to separate the bit line BL from upper layers like the silicon oxide film 37. The specific value of β is 20 nm, for example.

Figure 14:
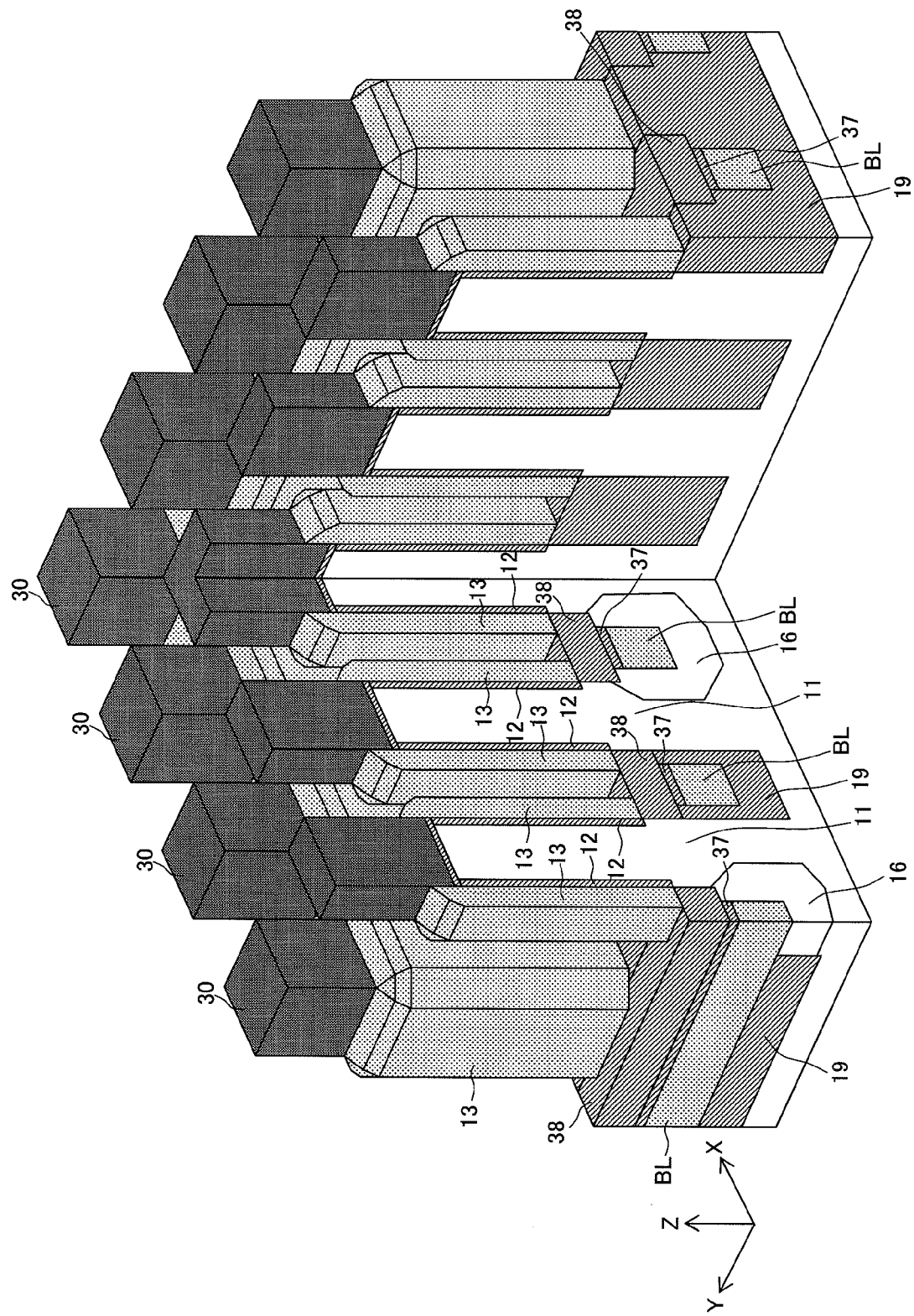

The side surface of the silicon pillar 11 is then oxidized to form the gate insulating film 12 as shown in FIG. 14. Polysilicon is formed on the entire silicon substrate and etched back. As a result, the gate electrode 13 shown in FIG. 14 is formed around the silicon pillar 11. The thickness of the gate electrode 13 is set so that the gate electrodes 13 do not contact with each other between adjacent silicon pillars 11 (so that separation of the gate electrodes 13 is ensured). Specifically, when the minimum feature dimension F is 40 nm, the thickness of the gate electrode 13 is preferably 15 nm.

Figure 15:
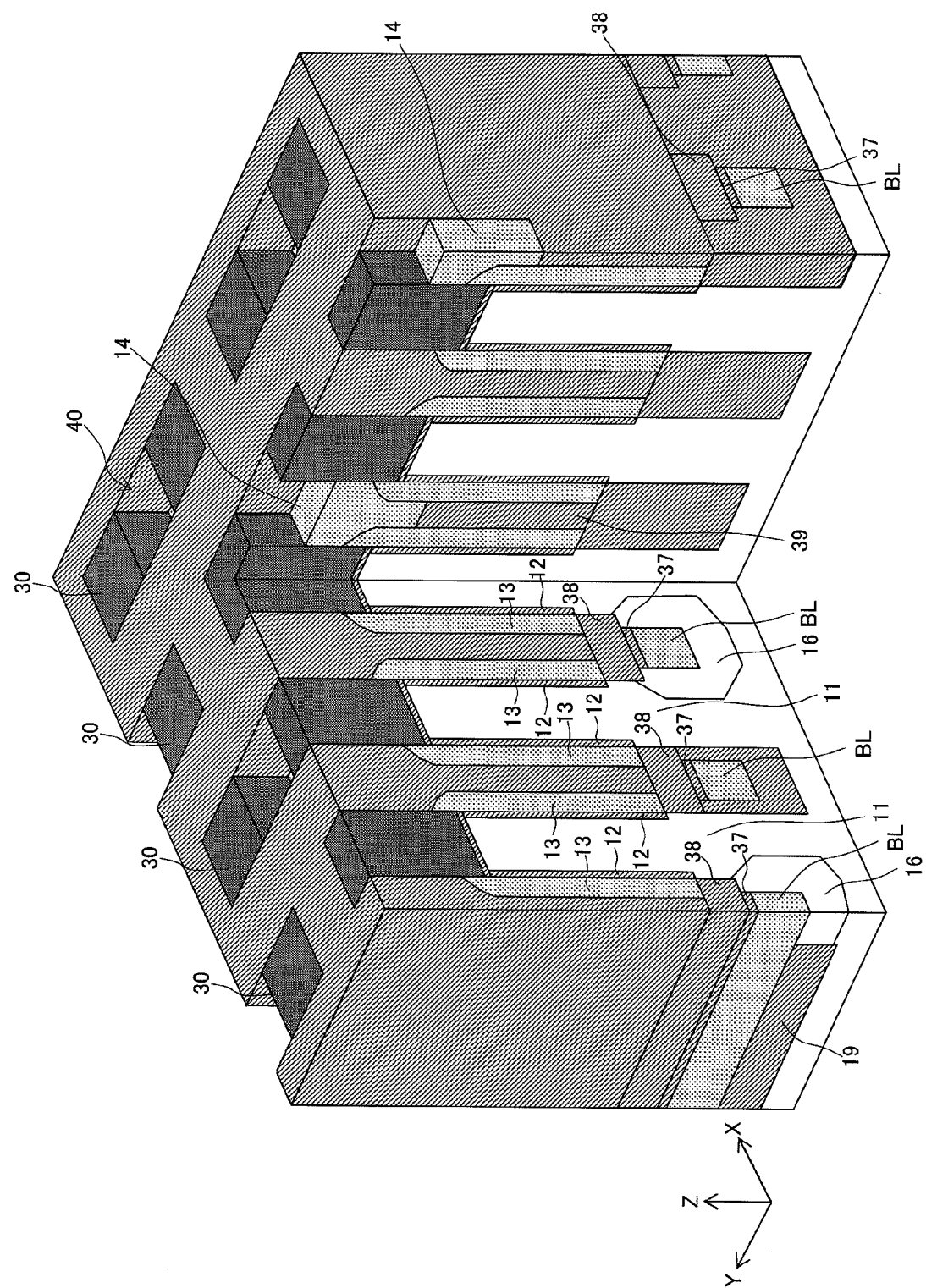

As shown in FIG. 15, a silicon oxide film 39 is buried in the space between the silicon pillars 11 and flattened by CMP so that the surface of the pattern 30 (the first mask pattern) is exposed. The silicon oxide film 39 is then etched back. As a result, a gate contact hole 40 shown in FIG. 15 is formed, a laminated film of titanium nitride and tungsten is then formed within the hole and etched back, so that the gate contact 14 is formed. The gate contact 14 connects the gate electrodes 13 formed on the sidewalls of two silicon pillars 11 adjacent to each other in the Y direction in alternate columns in the X and Y directions.

Figure 16:
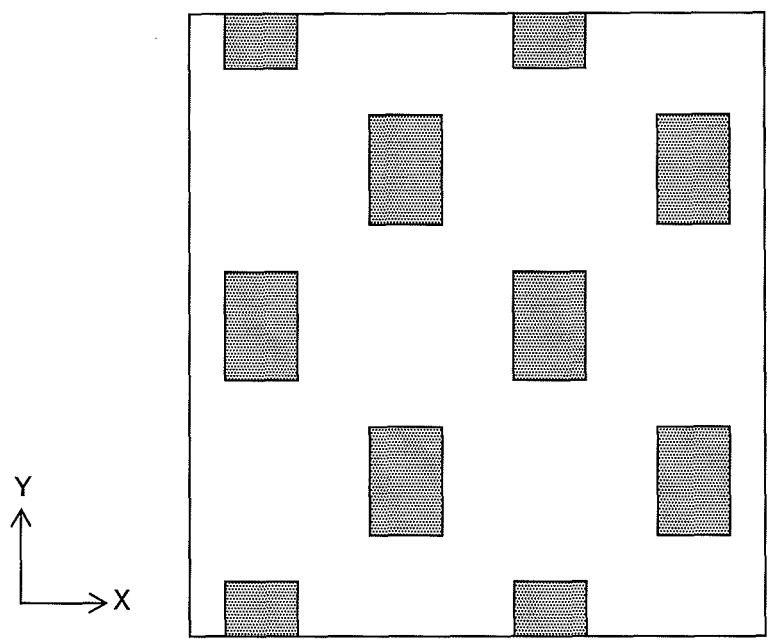

When etching back the silicon oxide film 39, a mask pattern shown in FIG. 16 is used. The mask pattern has sub-mask patterns for forming the gate contact hole 40 and is formed by photolithography, for example. When exposure is performed using the mask pattern of FIG. 16, the exposure is performed so that a non-hatched area is masked.

Figure 17:
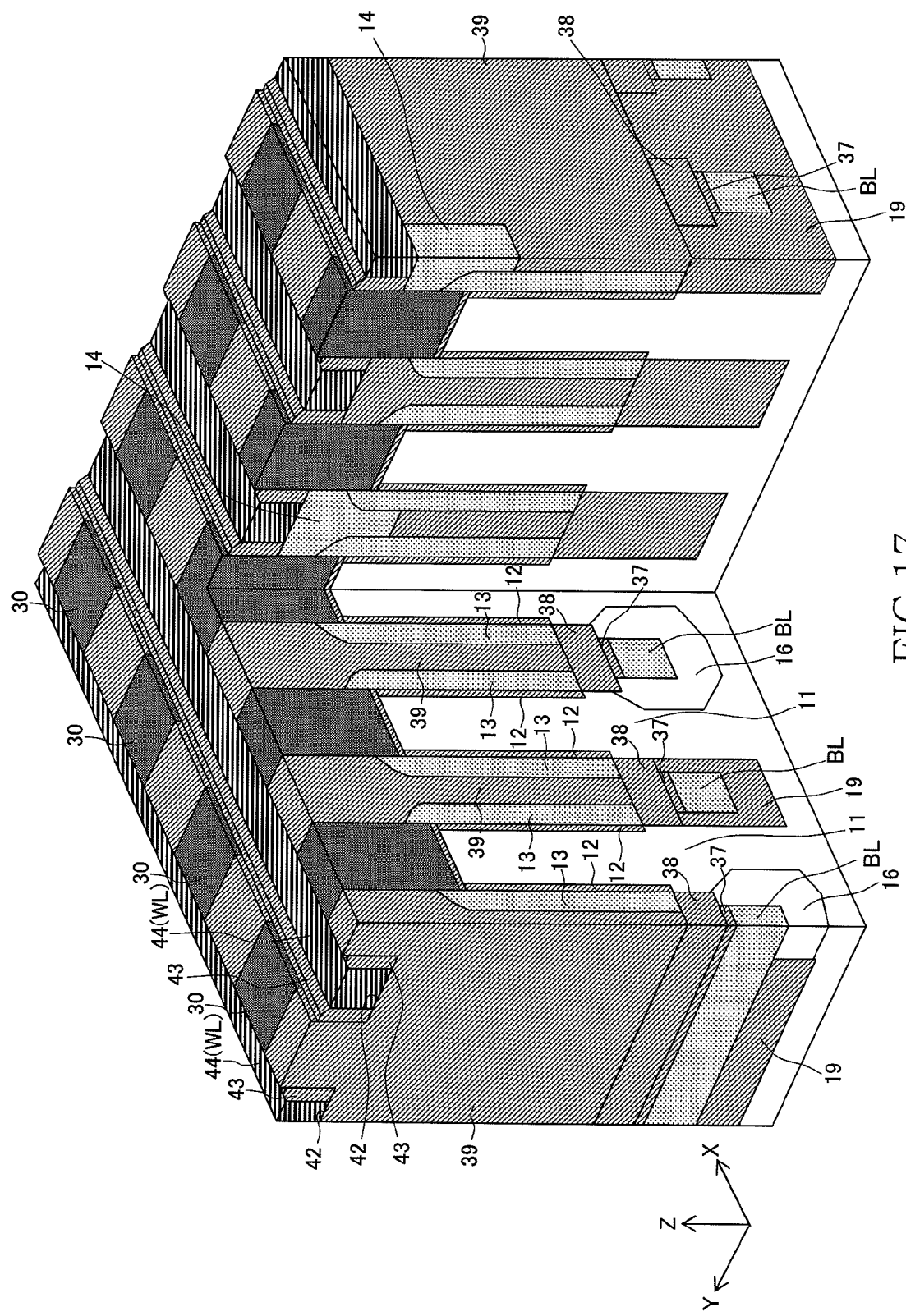
Figure 18:
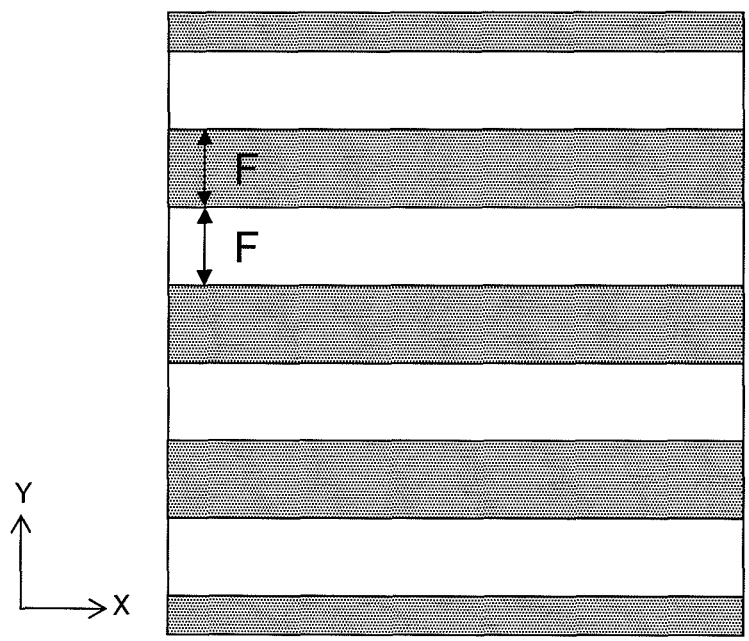
Figure 19:
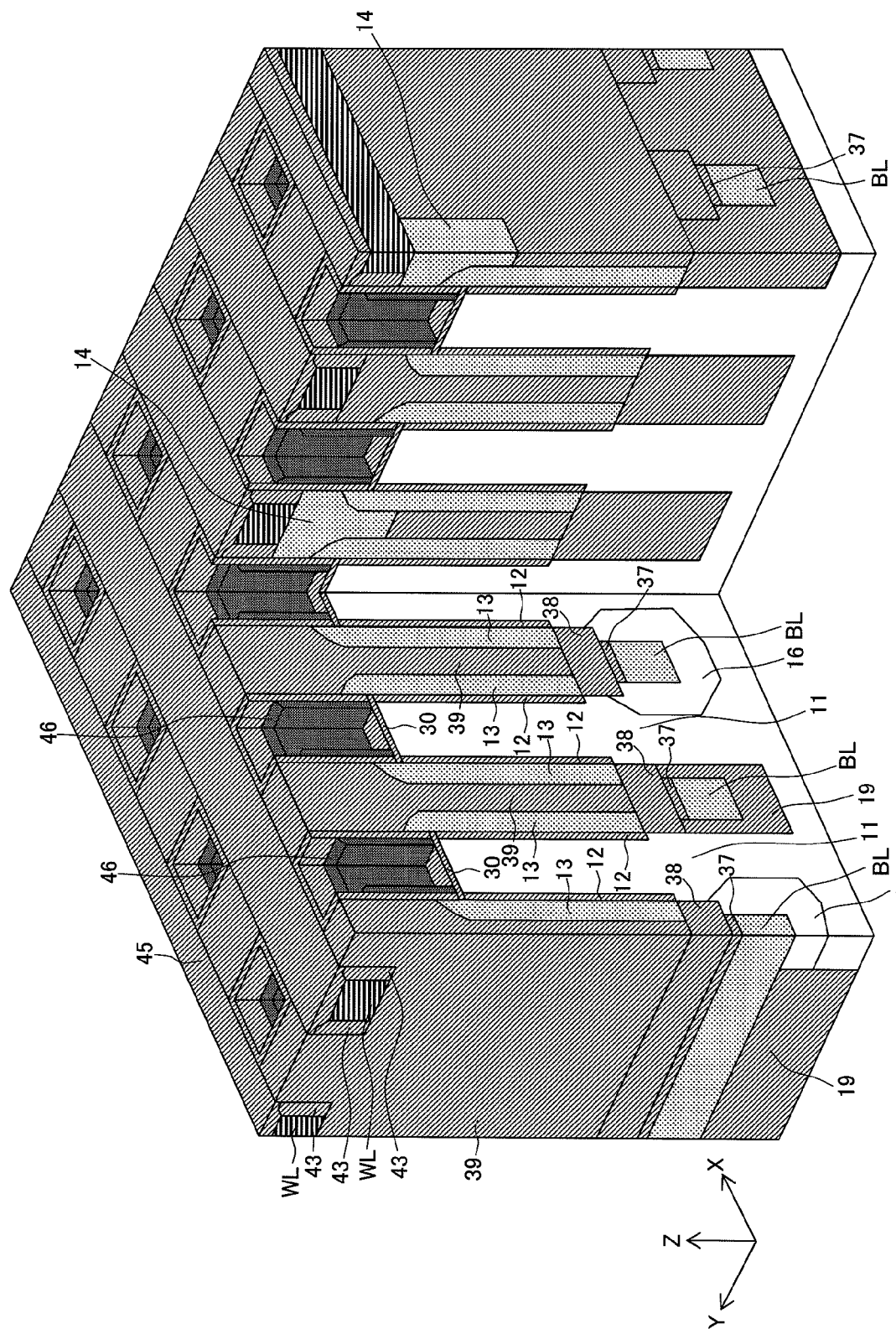

The gate contact hole 40 is then buried by a silicon oxide film and the silicon oxide film and the silicon oxide film 39 are etched back. As a result, a trench 42 extending in the X direction is formed between the silicon pillars 11 as shown in FIG. 17. At the time of etching back, a mask pattern with stripe patterns having a width of F and an interval of F is used as shown in FIG. 18. The longitudinal direction of the stripe pattern is the X direction. A depth of the trench 42 is set so that the surface of the gate contact 14 is exposed. A silicon oxide film is laminated on the entire silicon substrate and etched back, so that a sidewall oxide film 43 is formed on the sidewall of the trench 42 as shown in FIG. 17. The sidewall oxide film 43 is formed to prevent word line material from being exposed on an inner surface of the hole when the pattern 30 is removed in a subsequent step (FIG. 19). A wiring material 44 (a polysilicon film or laminated film of titanium nitride and tungsten) which becomes the word line WL is further formed within the trench 42 and etched back. The word line WL electrically connected to the gate contact 14 is thus formed.

Figure 20:
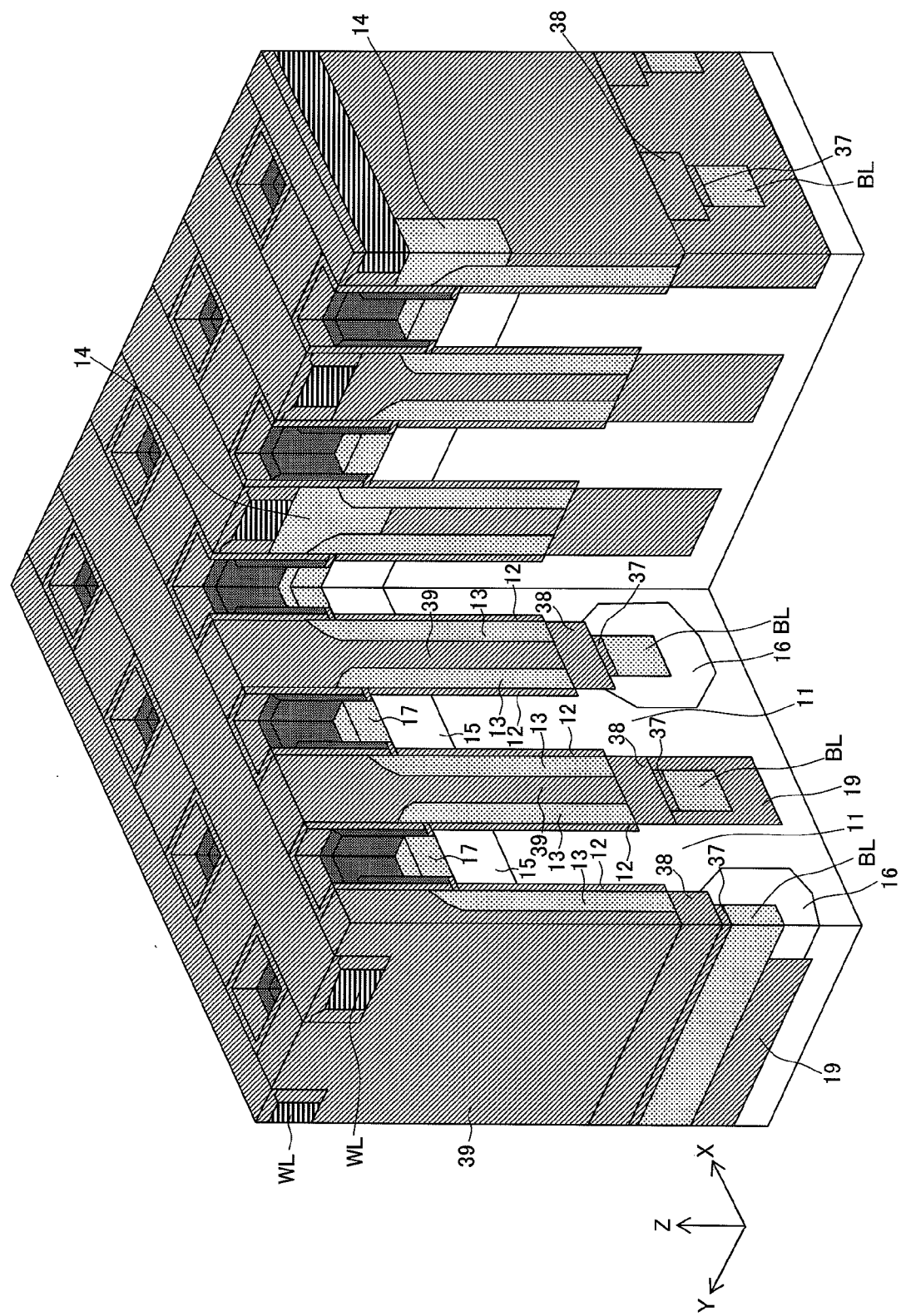

As shown in FIG. 19, a silicon oxide film 45 is buried in the trench 42 and flattened by CMP. The silicon nitride film constituting the pattern 30 is removed by wet etching using hot phosphoric acid and a sidewall nitride film 46 is formed in the resultant hole by etching back. At the time of etching back, the silicon oxide film (a silicon oxide film constituting the pattern 30) formed on the top surface of the silicon pillar 11 is also removed as shown in FIG. 20. Epitaxial crystal growth of silicon is made to occur from the top surface of the silicon pillar 11 to form the epitaxial layer 17. The N-type impurity diffusion region 15 is further formed at the top end of the silicon pillar 11 by ion implantation.

Figure 21:
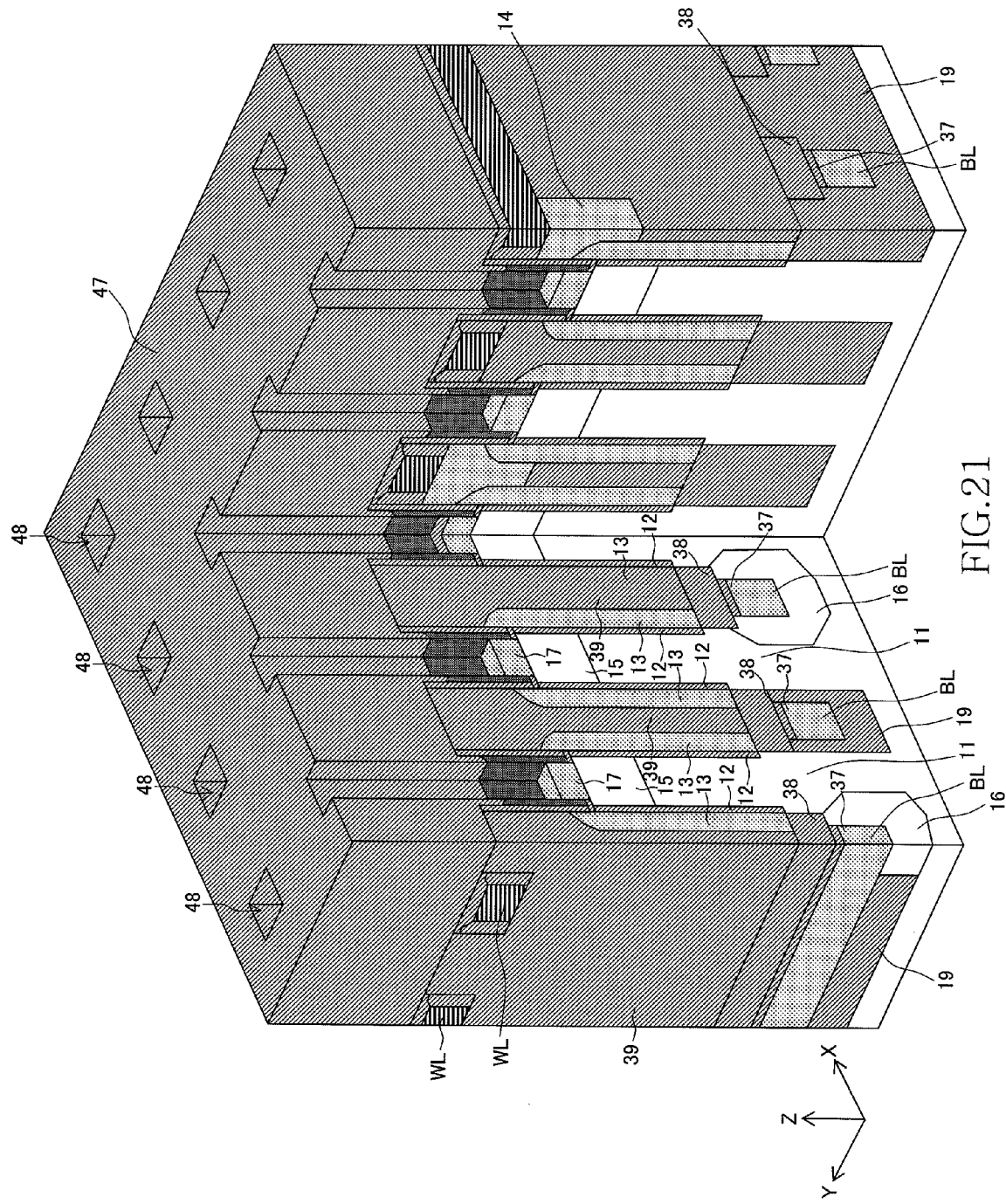
Figure 22:
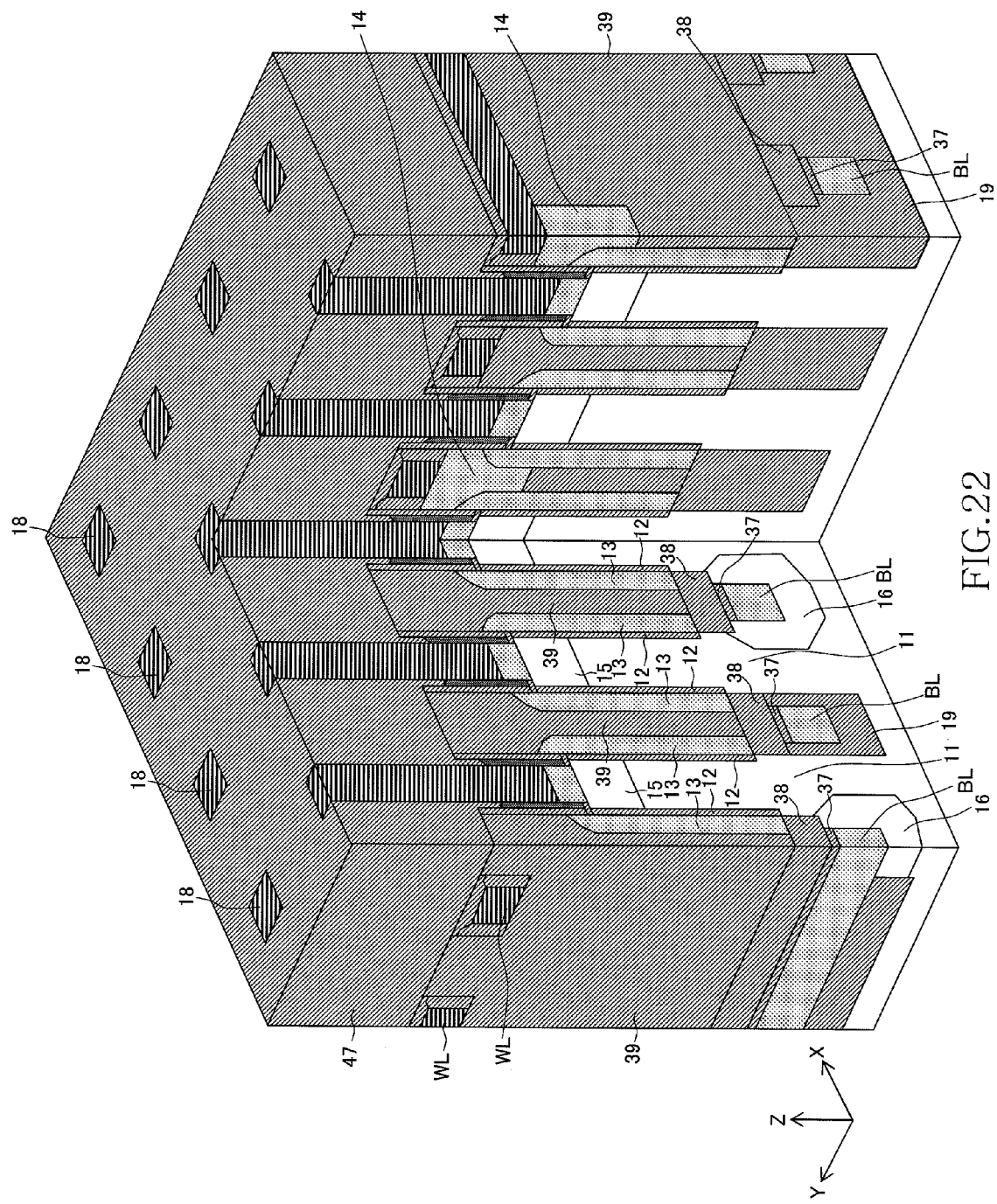

As shown in FIG. 21, a silicon oxide film 47 is formed and a contact hole 48 for a capacitance contact is formed. A capacitance contact material such as tungsten is buried in the contact hole 48, so that the contact plug 18 is formed as shown in FIG. 22. Thereafter, a cell capacitor is further formed on an upper layer, so that the memory cell is completed.

According to the manufacturing method described above, the opening for connecting the bit line BL to the silicon pillar 11 can be easily formed.

It is apparent that the present invention is not limited to the above embodiments, but may be modified and changed without departing from the scope and spirit of the invention.

Figure 23:
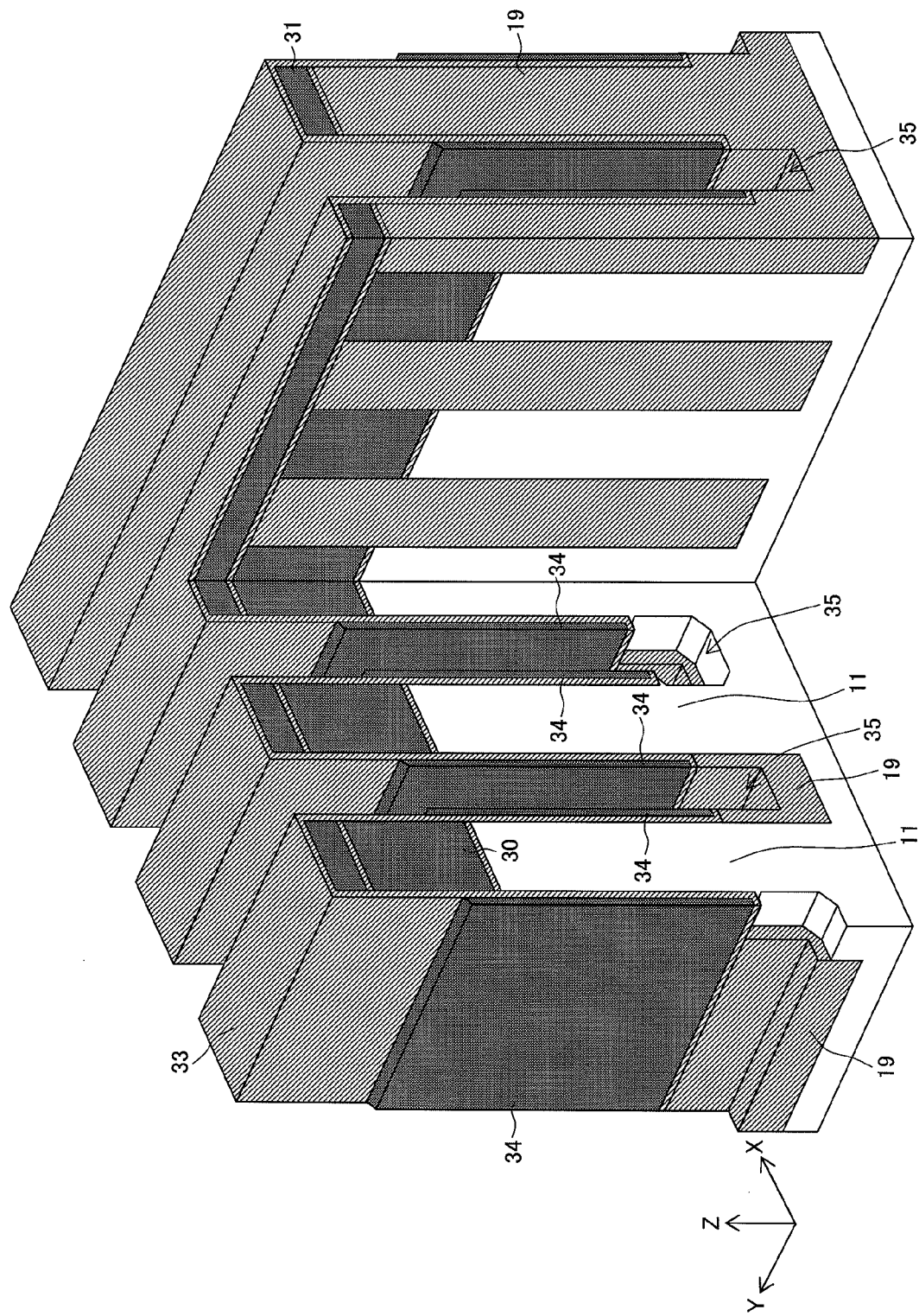
FIGS. 23 and 24 are side perspective cross-sectional views of the semiconductor memory device according to the deformed example of the present invention and show a part of the manufacturing process of the semiconductor memory device, respectively.
Figure 24:
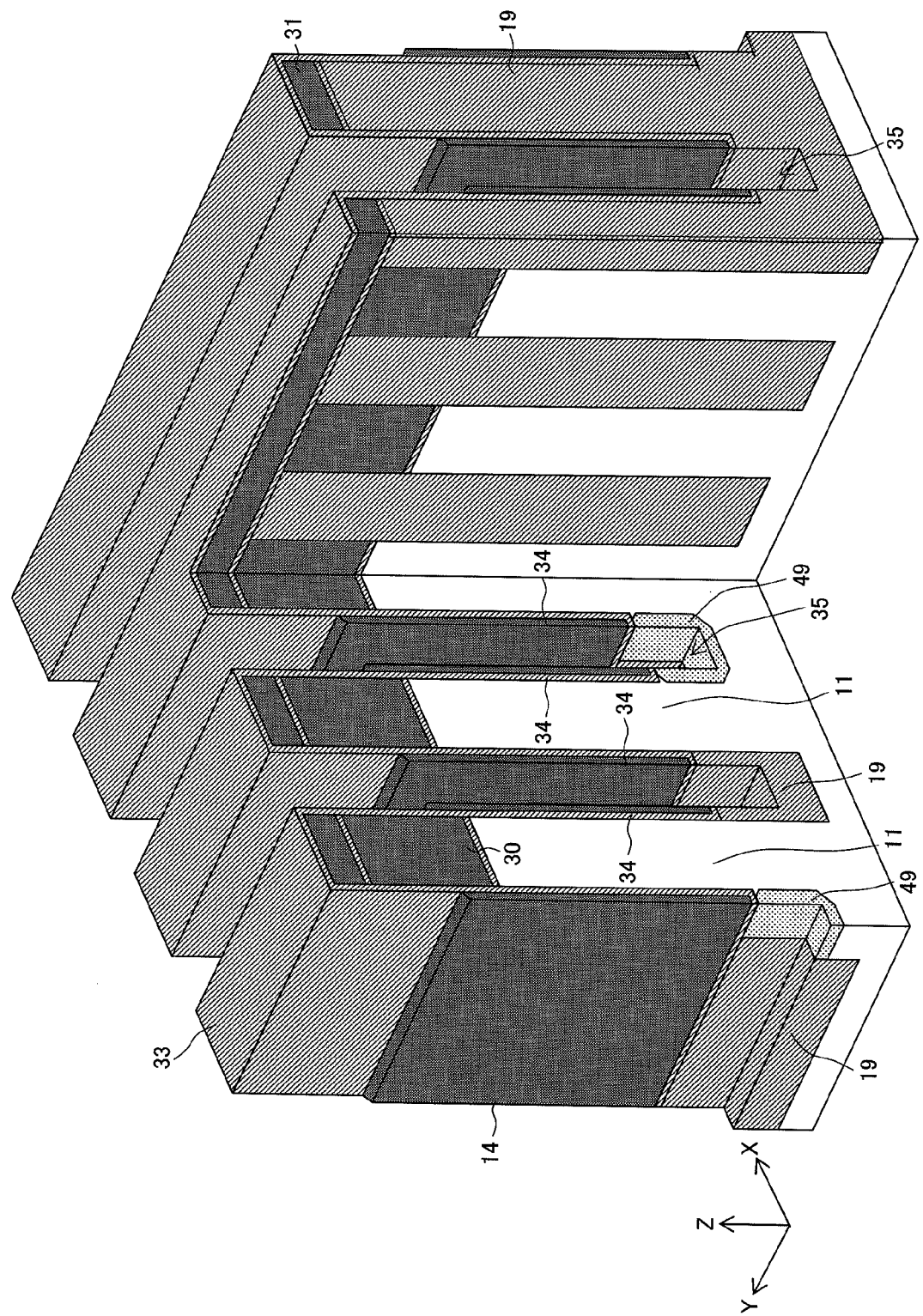

For example, while high density polysilicon is used for the bit line BL in the embodiment described above, the bit line BL can be made of metal materials. In this case, silicon wet etching is performed in the state of FIG. 10 to extend the part of the trench 35 that the silicon oxide film 19 is not provided as shown in FIG. 23. As shown in FIG. 24, an inner wall surface of the extended part is covered by a polysilicon film 49. Specifically, high density polysilicon is formed entirely and etched using the sidewall nitride film 34, so that the polysilicon film 49 is formed. At this time, the impurity diffusion region 16 is formed within the silicon pillar 11 around the high density polysilicon 36 because of impurity diffusion from polysilicon.

A metal material (such as tungsten) which becomes the bit line BL is then formed in the trench 35 and etched back, thereby forming the bit line BL. The silicon oxide film 33, the sidewall nitride film 34, and the stripe pattern 31 (the second mask pattern) are removed, the silicon oxide film 38 is buried between the silicon pillars 11, and flattened by CMP so that the surface of the pattern 30 (the first mask pattern) is exposed. Subsequent steps are identical to those of FIG. 13 and the subsequent drawings.

Silicide and metal nitride can be formed between the polysilicon film 49 and the metal material. In this case, a high melting point metal material such as titanium is deposited on the polysilicon film 49 by CVD to form silicide. Further, under ammonium atmosphere, metal nitride (titanium nitride) is formed. A metal material such as tungsten is then formed on the metal nitride. By using silicide like this, a direct current resistance of the bit line BL can be reduced.

Further, the bit line BL can be formed without using polysilicon. In this case, a phosphorous treatment is performed in the state of FIG. 23 and an impurity in vapor phase is diffused directly to the silicon substrate to form the impurity diffusion region 16. Silicide, titanium nitride, and tungsten are then formed in the trench 35 by the method described above to form the bit line BL.

In addition, while not specifically claimed in the claim section, the applicant reserves the right to include in the claim section of the application at any appropriate time the following methods:

A1. A manufacturing method of a semiconductor memory device comprising:

forming a silicon pillar group including a plurality of silicon pillars arranged in matrix and a plurality of silicon bridges each of which connects lower parts of two silicon pillars adjacent to each other in a row direction in alternate rows and columns, lower parts among the silicon pillars being filled with an insulating layer, a height of the insulating layer being at least as same as that of a top surface of the silicon bridges;

forming bit trenches along bit-line-forming areas that extend to a column direction located between the silicon pillars by etching the silicon bridges and the insulating layer; and forming bit lines each buried in an associated one of the bit trenches.

A2. The manufacturing method of a semiconductor memory device as claimed in claim A1, wherein forming the silicon pillar group includes:

etching a silicon substrate to a first depth using a first mask pattern that masks areas where the silicon pillars and the silicon bridges are formed;

forming an insulating layer that is buried in trenches formed by the etching; and etching the silicon substrate and the insulating layer to a second depth that is shallower than the first depth using a second mask pattern that masks an area other than the bit-line-forming areas.

A3. The manufacturing method of a semiconductor memory device as claimed in claim A1, wherein forming the bit trenches includes forming sidewall insulating films each of which is formed on a sidewall of each of the silicon pillars and the bit trenches are formed after the sidewall insulating films are formed.

A4. The manufacturing method of a semiconductor memory device as claimed in claim A1, further comprising:

forming gate insulating films and gate electrodes each of which is formed on a sidewall of each of the silicon pillars above the bit line with an insulating film interposed between the gate electrode and the bit line;

forming gate contacts each of which connects the gate electrodes formed on sidewalls of two silicon pillars adjacent to each other in the column direction in alternate rows and columns; and forming word lines each electrically connected to associated ones of the gate contacts.

A5. The manufacturing method of a semiconductor memory device as claimed in claim A4, further comprising forming a diffusion layer at a top of each of the silicon pillars.

B1. A manufacturing method of a semiconductor memory device comprising:

etching a silicon substrate to a first depth using a plurality of first mask patterns each masking two silicon-pillar-forming areas adjacent to each other in a row direction, the first mask patterns masking two silicon-pillar-forming areas alternately every other rows;

forming an insulating layer that is buried in trenches formed by etching the silicon substrate;

etching the silicon substrate and the insulating layer to a second depth that is shallower than the first depth using a second mask pattern that masks an area other than bit-line-forming areas that extend to a column direction located between silicon pillars;

forming bit trenches along the bit-line-forming areas by etching the silicon substrate and the insulating layer; and forming bit lines each buried in an associated one of the bit trenches.

B2. The manufacturing method of a semiconductor memory device as claimed in claim B1, wherein forming the bit trenches includes forming sidewall insulating films each of which is formed on a sidewall of each of the silicon pillars and the bit trenches are formed after the sidewall insulating films are formed.

B3. The manufacturing method of a semiconductor memory device as claimed in claim B1, further comprising:

forming gate insulating films and gate electrodes each of which is formed on a sidewall of each of silicon pillars above the bit line with an insulating film interposed between the gate electrode and the bit line;

forming a gate contacts each of which connects the gate electrodes formed on sidewalls of two silicon pillars adjacent to each other in the column direction in alternate rows and columns; and forming word lines each electrically connected to associated ones of the gate contact.

B4. The manufacturing method of a semiconductor memory device as claimed in claim B3, further comprising forming a diffusion layer at a top of each of the silicon pillars.

What is claimed is:

1. A semiconductor memory device comprising:
a first bit line and a first word line orthogonal to each other;
first to fourth semiconductor pillars each having a sidewall, a top end and a bottom end;
first to fourth memory elements connected to the top end of the first to fourth semiconductor pillars, respectively;
first to fourth gate electrodes covering the sidewall of the first to fourth semiconductor pillars, respectively via a gate insulating film interposed therebetween, wherein
the first and second semiconductor pillars are adjacent to each other with the first bit line interposed therebetween,
the third and fourth semiconductor pillars are adjacent to each other with the first bit line interposed therebetween,
the first and third semiconductor pillars are adjacent to each other with the first word line interposed therebetween,
the second and fourth semiconductor pillars are adjacent to each other with the first word line interposed therebetween,
the first bit line is electrically connected to the bottom ends of the third and fourth semiconductor pillars, and the first word line is electrically connected to the first and third gate electrodes; and the first bit line is free from being electrically connected to the bottom ends of the first and second semiconductor pillars, and the first word line is free from being electrically connected to the second and fourth gate electrodes.

2. A semiconductor memory device comprising:

a first bit line and a first word line orthogonal to each other;

first to fourth semiconductor pillars each having a sidewall, a top end and a bottom end;

first to fourth memory elements connected to the top end of the first to fourth semiconductor pillars, respectively;

first to fourth gate electrodes covering the sidewall of the first to fourth semiconductor pillars, respectively via a gate insulating film interposed therebetween, wherein the first and second semiconductor pillars are adjacent to each other with the first bit line interposed therebetween, the third and fourth semiconductor pillars are adjacent to each other with the first bit line interposed therebetween, the first and third semiconductor pillars are adjacent to each other with the first word line interposed therebetween, the second and fourth semiconductor pillars are adjacent to each other with the first word line interposed therebetween, the first bit line is electrically connected to the bottom ends of the third and fourth semiconductor pillars, and the first word line is electrically connected to the first and third gate electrodes;

a second bit line parallel to the first bit line;

fifth and sixth semiconductor pillars each having a sidewall, a top end, and a bottom end;

fifth and sixth memory elements connected to the top end of the fifth and sixth semiconductor pillars, respectively;

fifth and sixth gate electrodes covering the sidewall of the fifth and sixth semiconductor pillars, respectively via a gate insulating film interposed therebetween, wherein the first and second bit lines are adjacent to each other with the second and fourth semiconductor pillars interposed therebetween, the second and fifth semiconductor pillars are adjacent to each other with the second bit line interposed therebetween, the fourth and sixth semiconductor pillars are adjacent to each other with the second bit line interposed therebetween, the fifth and sixth semiconductor pillars are adjacent to each other with the first word line interposed therebetween, the second bit line is electrically connected to the bottom ends of the second and fifth semiconductor pillars, and the first word line is further electrically connected to the fifth and sixth gate electrodes; and the second bit line is not electrically connected to the bottom ends of the fourth and sixth semiconductor pillars.

3. A semiconductor memory device comprising:

a semiconductor substrate;

a plurality of bit lines each extending in a first direction and buried in the semiconductor substrate, the plurality of bit lines including first, second and third bit lines being arranged in that order, the first, second and third bit lines each having first and second side walls facing to each other;

a plurality of semiconductor pillars arranged in a matrix and including first and second semiconductor pillars adjacently placed to each other, the first semiconductor pillar being placed between the first and second bit lines, the second semiconductor pillar being placed between the second and third bit lines;

a plurality of gate electrodes each covering a sidewall of an associated one of the semiconductor pillars via a gate insulating film, the plurality of gate electrodes each being placed on an associated one of the first, second and third bit lines via a first insulating film;

a second insulating film interposed between the second side wall of the first bit line and the first semiconductor pillar, a third insulating film interposed between the first side wall of the third bit line and the second semiconductor pillar; and a diffusion region placed between the first side wall of the second bit line and the first semiconductor pillar, and the diffusion region placed between the second side wall of the second bit line and the second semiconductor pillar, so that the first and second semiconductor pillar are electrically connected to the second bit line via the diffusion region.

4. The semiconductor memory device as claimed in claim 3, wherein the plurality of gate electrodes include a first gate electrode provided around the first semiconductor pillar and a second gate electrode provided around the second semiconductor pillar;

the first gate electrode is physically separated from the second gate electrode; and the first gate electrode includes a first portion and a second portion opposed to each other in the first direction, the semiconductor memory device further comprises:

a gate contact provided in contact with the first portion and none of gate contact being in contact with the second portion.

5. The semiconductor memory device as claimed in claim 3, wherein a plurality of memory elements is each connected to the top end of an associated one of the semiconductor pillars.

* * * * *